US009457605B2

(12) United States Patent
Miyake et al.

(10) Patent No.: US 9,457,605 B2
(45) Date of Patent: Oct. 4, 2016

(54) SCREEN PRINTING MACHINE

(75) Inventors: Yasushi Miyake, Shizuoka (JP); Takeshi Fujimoto, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 45 days.

(21) Appl. No.: 14/123,011

(22) PCT Filed: Feb. 6, 2012

(86) PCT No.: PCT/JP2012/000777
§ 371 (c)(1),
(2), (4) Date: Nov. 27, 2013

(87) PCT Pub. No.: WO2012/164780
PCT Pub. Date: Dec. 6, 2012

(65) Prior Publication Data
US 2014/0109779 A1  Apr. 24, 2014

(30) Foreign Application Priority Data

May 31, 2011 (JP) ................. 2011-122925

(51) Int. Cl.
| B41L 15/00 | (2006.01) |
| B41L 21/02 | (2006.01) |
| H05K 3/12 | (2006.01) |
| B41F 15/08 | (2006.01) |

(Continued)

(52) U.S. Cl.
CPC ............ B41L 21/02 (2013.01); B41F 15/0881 (2013.01); B41F 15/26 (2013.01); H05K 3/1233 (2013.01); *B41P 2215/50* (2013.01); *H05K 3/3484* (2013.01)

(58) Field of Classification Search
CPC .... B41F 15/08; B41F 15/0818; B41F 15/34; B41F 15/16; B41F 15/18; B41F 15/36; B41F 35/003; B41F 35/005; B41F 35/007; B41F 15/26; H05K 13/0465; B41L 21/02; B41P 2215/50
See application file for complete search history.

(56) References Cited

U.S. PATENT DOCUMENTS

| 7,219,787 | B2* | 5/2007 | Kabeshita et al. ......... 198/346.2 |
| 2010/0242755 | A1 | 9/2010 | Nagao |
| 2010/0313773 | A1 | 12/2010 | Naoi et al. |
| 2011/0017080 | A1 | 1/2011 | Miyahara et al. |

(Continued)

FOREIGN PATENT DOCUMENTS

| GB | 2470869 A | 12/2010 |
| JP | 2002-225221 A | 8/2002 |

(Continued)

OTHER PUBLICATIONS

International Search Report; PCT/JP2012/00077; Mar. 6, 2012.

(Continued)

*Primary Examiner* — Matthew G Marini
(74) *Attorney, Agent, or Firm* — Studebaker & Brackett PC

(57) ABSTRACT

An inexpensive small-sized screen printing machine having low redundancy and high production efficiency and applicable to a dual conveying-type component mounting machine. A pair of substrate supporting tables juxtaposed in a specific direction is provided. Screen printing is alternately performed by a single print executing section in a common area which can be shared by the two substrate supporting tables. In doing so, when one substrate supporting table located at a print position among the pair of substrate supporting tables starts exiting the print position, the other substrate supporting table starts entry to the print position.

20 Claims, 16 Drawing Sheets

(51) Int. Cl.
  *B41F 15/26* (2006.01)
  *H05K 3/34* (2006.01)

(56) References Cited

U.S. PATENT DOCUMENTS

| | | |
|---|---|---|
| 2012/0085252 A1 | 4/2012 | Miyahara et al. |
| 2012/0085253 A1 | 4/2012 | Nagao |
| 2012/0085254 A1 | 4/2012 | Nagao |
| 2012/0090484 A1 | 4/2012 | Miyahara et al. |

FOREIGN PATENT DOCUMENTS

| | | |
|---|---|---|
| JP | 2007-062205 A | 3/2007 |
| JP | 2008-272964 A | 11/2008 |
| JP | 2009-070867 A | 4/2009 |
| JP | 2011-131488 A | 7/2011 |
| JP | 2011-143640 A | 7/2011 |
| WO | WO 2009035136 A1 * | 3/2009 |

OTHER PUBLICATIONS

The extended European search report issued by the European Patent Office on Apr. 17, 2015, which corresponds to European Patent Application No. 12792323.3-1704 and is related to U.S. Appl. No. 14/123,011.

* cited by examiner

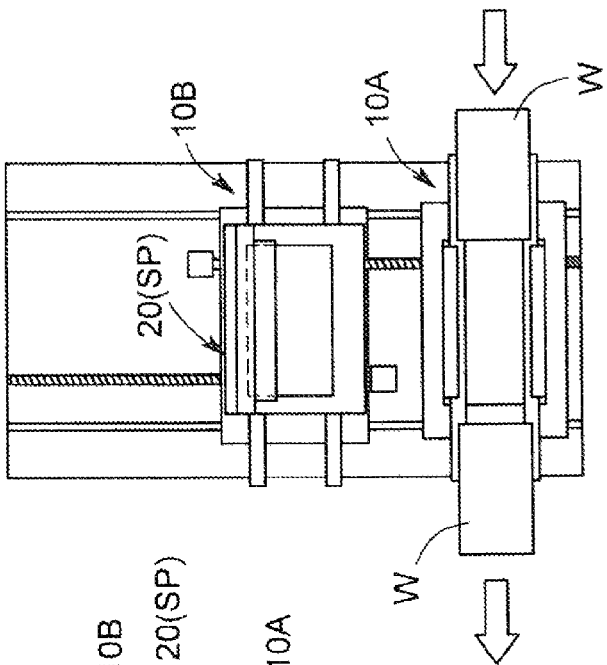
FIG.5A A-SIDE PRINTING B-SIDE STANDING BY
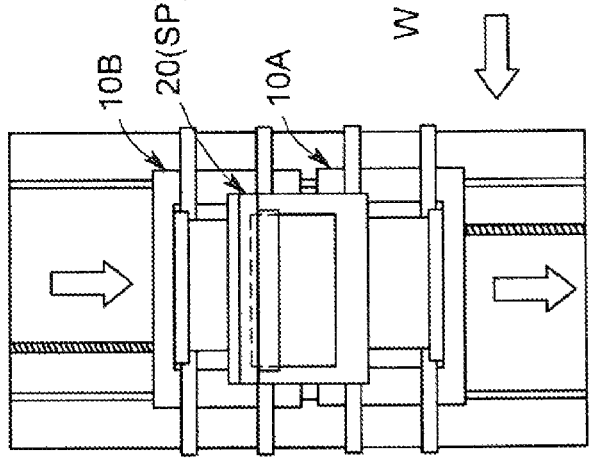
FIG.5B PARALLEL MOVEMENT
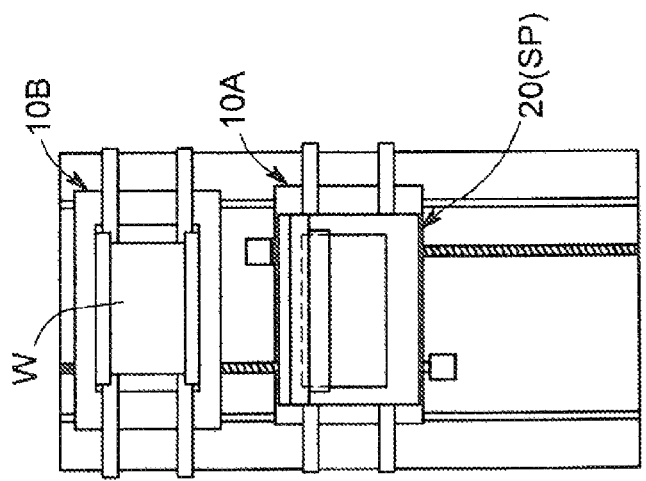
FIG.5C A-SIDE CARRY-IN OR CARRY-OUT B-SIDE PRINTING

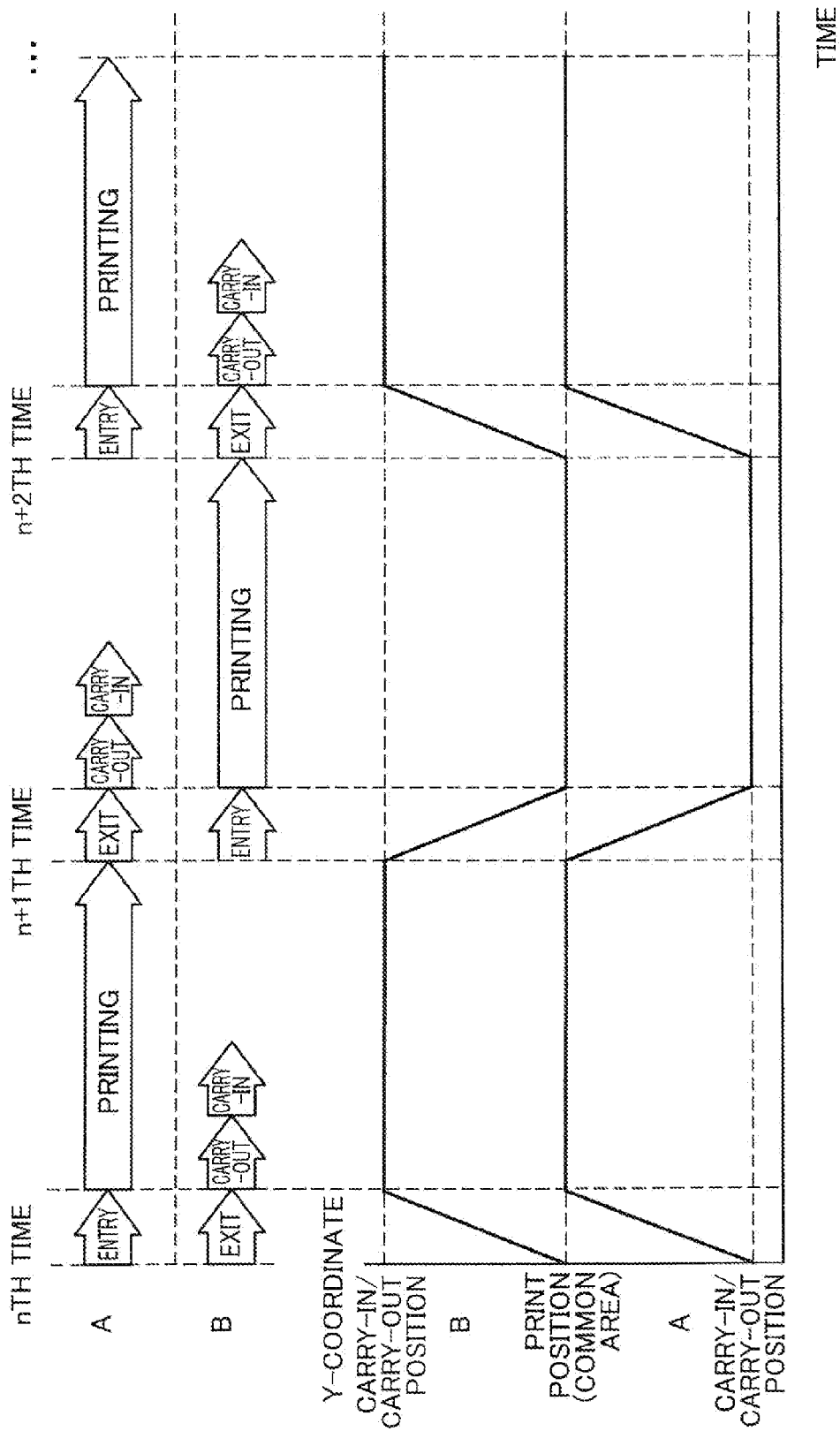

A-SIDE PRINTING
B-SIDE STANDING BY

PARALLEL MOVEMENT

A-SIDE CARRY-IN OR CARRY-OUT
B-SIDE PRINTING

SCREEN PRINTING MACHINE

TECHNICAL FIELD

The present disclosure relates to a screen printing machine and, in particular, to a screen printing machine that performs screen printing of a cream solder, a conductive paste, or the like on a substrate such as a printed wiring board (PWB) as pretreatment for mounting electronic components on the substrate.

BACKGROUND ART

A screen printing machine is incorporated in a production line of a printed circuit board (PCB) and is designed to perform screen printing of a conductive paste or the like on a substrate conveyed from upstream and to send the substrate to a downstream component mounting machine. In order to improve production efficiency, a screen printing machine has been developed as disclosed in Japanese Patent Application Laid-Open No. 2009-70867, for example, in which a pair of substrate supporting tables juxtaposed in a horizontal direction that intersect with a substrate conveying direction is provided in the machine and each substrate supporting table is provided with an print executing section. Such a screen printing machine has been developed so as to accommodate a so-called dual conveying-type component mounting machine which has two substrate conveying lines and which concurrently carries out (in parallel) component mounting on both conveying lines, and is intended to improve efficiency of a printing process in accordance with an increased speed of a component mounting process by coupling the screen printing machine and the component mounting machine with each other.

However, with the configuration according to Japanese Patent Application Laid-Open No. 2009-70867, a construction of each print executing section is unnecessarily redundant and wasteful. Especially, in cases where substrates of the same type are consecutively produced, the need to create two screen masks arranged with a same opening pattern results in an increased cost of screen masks. In addition, the need to prepare solder on each screen mask results in an excessive amount of solder necessary for preparation, and a corresponding high cost of post-production solder treatment (disposal, storage, and the like). Furthermore, due to the redundant construction that combines the same print executing sections arranged to the left and right, considerable space for arranging the respective print executing sections must be secured. As a result, sizes of the machine itself as well as conveyors of an accompanying substrate sorting machine and the like tend to increase.

The present disclosure has been made in consideration of the problems described above and an object thereof is to provide an inexpensive small-sized screen printing machine which has low redundancy and high production efficiency and which is applicable to a dual conveying-type component mounting machine.

SUMMARY OF THE DISCLOSURE

In order to achieve the object described above, the present disclosure provides a screen printing machine comprising: a pair of substrate supporting tables, each of which is provided for holding a substrate that is a print object, the substrate supporting tables being juxtaposed along a specific direction that is perpendicular to a conveying direction of the substrate; a printing executing section that performs a printing process, at a print position set in a common area in which both of the substrate supporting tables are movable in the specific direction, alternately on the substrate held by each of the substrate supporting table; a substrate supporting table driving mechanism that individually drives the pair of substrate supporting tables in the specific direction; and control means for controlling the substrate supporting table driving mechanism so that one of the substrate supporting tables that moves into a printing process enters the print position by moving in a direction approaching the counterpart substrate supporting table along the specific direction, while the other substrate supporting table that has completed the printing process at the print position exits the print position by moving in a direction receding from the counterpart substrate supporting table along the specific direction, wherein the control means controls the substrate supporting table driving mechanism so that one substrate supporting tables completes entry to the print position after the counterpart substrate supporting table at the print position completely exits the print position, in a way that at least parts of an exit period for the substrate supporting table to exit the print position and an entry period for the counterpart substrate supporting table to entry to the print position overlap each other. According to this mode, since one print executing section is shared by a pair of substrate supporting tables and screen printing can be alternately performed, redundancy of the print executing section can be avoided. Therefore, in cases where substrates of the same type are consecutively produced by both substrate supporting tables, a single screen mask can be shared and therefore a cost for screen masks can be cut in half. In addition, since a single screen mask can be shared, solder necessary for preparation is kept to a necessary and sufficient amount. Therefore, cost reduction can also be achieved in post-production treatment (disposal, storage, and the like) of solder. Furthermore, since redundancy of the print executing section has been eliminated and a print position of the print executing section is set as a common area of the pair of substrate supporting tables, movement distances of the respective substrate supporting tables in a specific direction can be overlapped by an amount corresponding to the common area. As a result, a space for arranging the print executing section and a movement range of the substrate supporting tables can be kept compact and, in turn, the machine itself as well as accompanying conveyors can be downsized. Moreover, when the printing process is alternately repeated, since the substrate supporting table driving mechanism is controlled so that one substrate supporting tables completes entry to the print position after the counterpart substrate supporting table at the print position completely exits the print position, and at least parts of an exit period for the substrate supporting table to exit the print position and an entry period for the counterpart substrate supporting table to entry to the print position overlap each other, a switching operation between substrate supporting tables is expedited as much as practicable and processing efficiency is improved.

Other features, objects, configurations, and operational advantages of the present disclosure will be readily appreciated from the detailed description below when considered in connection with the accompanying drawings.

BRIEF DESCRIPTION OF THE DRAWINGS

FIGS. 5A through 5C are diagrams showing operational procedures for alternate printing based on the flow chart shown in FIG. 4.

FIG. 6 is a timing chart of alternate printing based on the flow chart shown in FIG. 4.

DETAILED DESCRIPTION OF THE PREFERRED EMBODIMENTS

Hereinafter, a best mode for carrying out the disclosure will be described with reference to the accompanying drawings.

Figure 1:
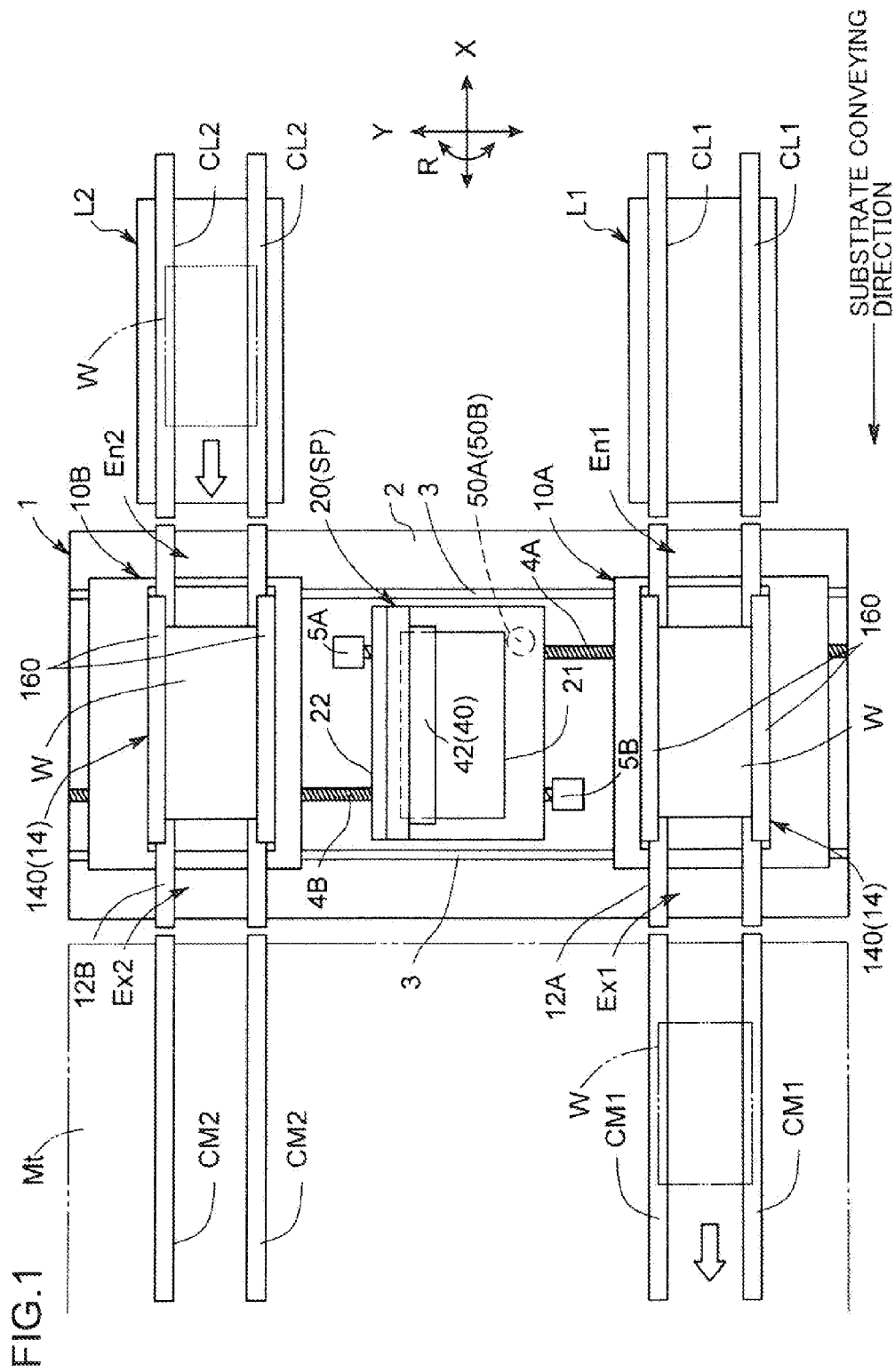
FIG. 1 is a schematic plan view of a screen printing machine according to an embodiment of the present disclosure.
Figure 2:
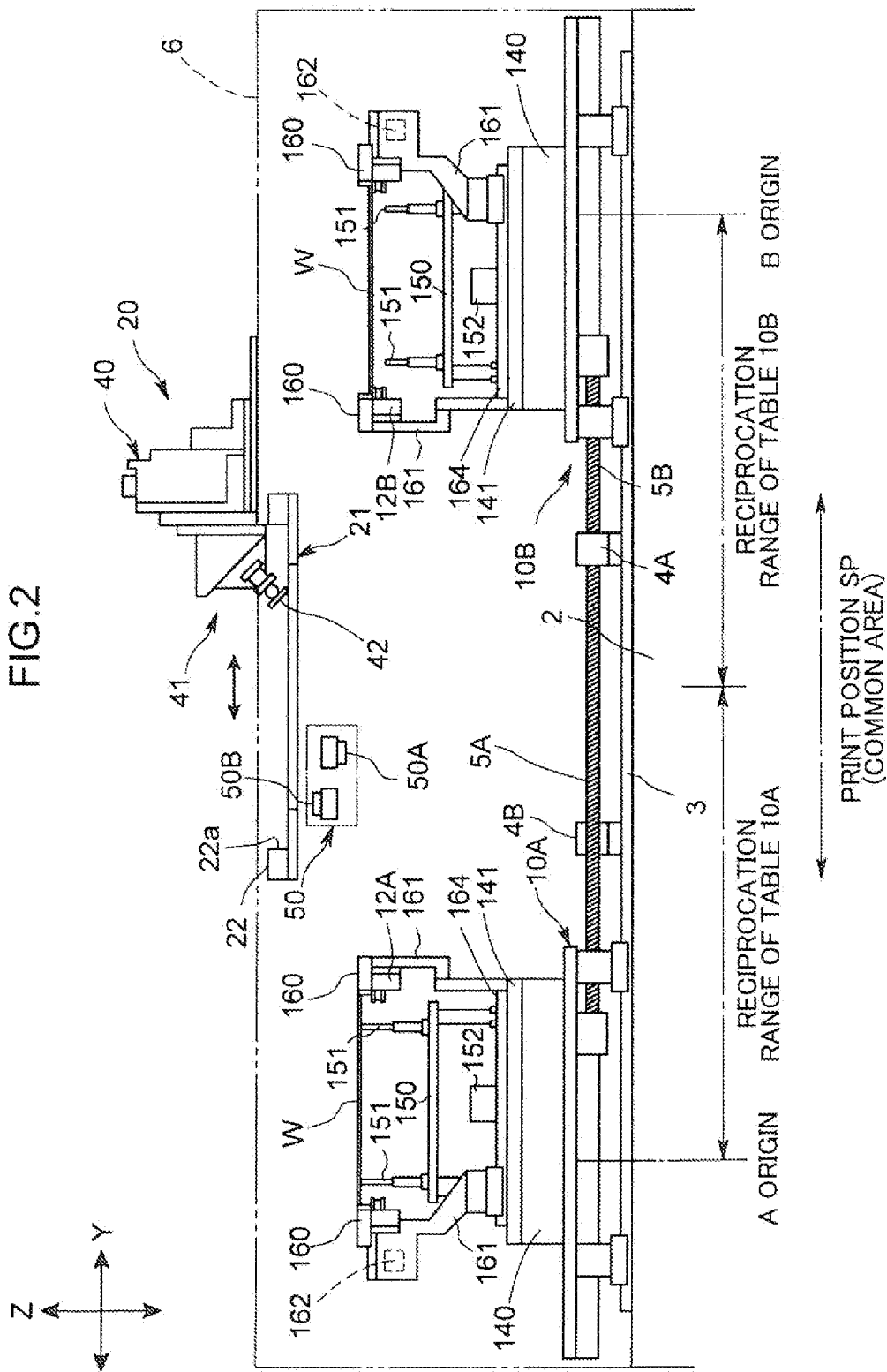
FIG. 2 is a schematic side view of the screen printing machine shown in FIG. 1.

Referring now to FIGS. 1 and 2, a screen printing machine 1 according to the present embodiment is incorporated into a printed circuit board (PCB) production line in a state where a dual conveying-type component mounting machine Mt is coupled to a downstream side of the screen printing machine 1. In the example shown, the screen printing machine 1 is disposed between two loaders L1 and L2 (also referred to as a first loader L1 and a second loader L2) arranged in parallel, and one component mounting machine Mt. The screen printing machine 1 is configured so as to perform screen printing on a substrate W fed from the respective upstream loaders L1 and L2 and send the substrate W to the downstream component mounting machine Mt.

The screen printing machine 1 will be described below by assuming that a conveying direction of the substrate W in a production line designates an X-axis direction, a direction perpendicular to the X-axis direction on a horizontal plane designates a Y-axis direction, and a direction (vertical direction) perpendicular to both X-axis and Y-axis directions designates a Z-axis direction. In the present embodiment, the Y-axis direction is an example of a "specific direction" according to the present disclosure.

The screen printing machine 1 has two substrate carry-in sections En1 and En2 (also referred to as a first substrate carry-in section En1 and a second substrate carry-in section En2) at an upstream end in the X-axis direction and two substrate carry-out sections Ex1 and Ex2 (also referred to as a first substrate carry-out section Ex1 and a second substrate carry-out section Ex2) at an opposite end (a downstream end in a substrate conveying direction), the substrate carry-out sections Ex1 and Ex2 corresponding to the substrate carry-in sections En1 and En2, and configured so as to carry a substrate W fed from the first loader L1 into the machine from the first substrate carry-in section En1, perform screen printing, and carry out the substrate W after the printing process to a first belt conveyor pair CM1 of the component mounting machine Mt from the first substrate carry-out section Ex1 and to carry a substrate W fed from the second loader L2 into the machine from the second substrate carry-in section En2, perform screen printing, and carry out the substrate W after the printing process to a second belt conveyor pair CM2 of the component mounting machine Mt from the second substrate carry-out section Ex2.

The first and second loaders L1 and L2 are respectively provided with first and second belt conveyor pairs CL1 and CL2. Meanwhile, the component mounting machine Mt is provided with two belt conveyor pairs CM1 and CM2 (also referred to as the first belt conveyor pair CM1 and the second belt conveyor pair CM2) which configure a substrate conveying line in correspondence with the first and second belt conveyor pairs CL1 and CL2. The substrate W is conveyed along these belt conveyor pairs CL1, CL2, CM1, and CM2.

On a base 2 of the screen printing machine 1, the screen printing machine 1 is provided with two substrate supporting tables 10A and 10B for supporting a substrate W, and one print executing section 20 which performs screen printing on the substrate W supported by the respective substrate supporting tables 10A and 10B at a print position SP set at a predetermined position (in the example shown, approximately center) above the base 2 by alternately moving the respective substrate supporting tables 10A and 10B in the Y-axis direction.

In the present embodiment, the print position SP is set at a fixed position. The first substrate carry-in section En1 and the first substrate carry-out section Ex1 are respectively provided at the substrate supporting table 10A, while the second substrate carry-in section En2 and the second substrate carry-out section Ex2 are respectively provided at the substrate supporting table 10B. As shown in FIG. 2, the print position SP is set at an appropriate location in a common area (in the example shown, an approximately central portion of the base 2). The common area here refers to an area to which both the substrate supporting tables 10A and 10B are movable on the base 2 along the Y-axis direction.

The substrate supporting tables 10A and 10B (referred to as a first substrate supporting table 10A and a second substrate supporting table 10B) are designed to receive a substrate W fed from the first loader L1 and the second loader L2, support the substrate W conveyed from the first and second substrate carry-in sections En1 and En2 at respective central portions of the substrate supporting tables 10A and 10B so that screen printing can be performed on the substrate W, and send the substrate W after the printing process from the corresponding substrate carry-out sections Ex1 and Ex1. Among these tables, the first substrate supporting table 10A receives a substrate W conveyed from the first substrate carry-in section En1, supports the substrate W so that screen printing can be performed by the print executing section 20, and subsequently moves to the print position SP. The second substrate supporting table 10B is configured so as to receive a substrate W conveyed from the second substrate carry-in section En2, support the substrate W so that screen printing can be performed by the print executing section 20, and subsequently move to the print position SP.

Each of the substrate supporting tables 10A and 10B has an approximately elongated rectangular shape in the X-axis direction in a plan view, and is configured so as to be individually moved in the Y-axis direction by a substrate supporting table driving mechanism that is embodied by threaded shafts 4A and 4B, motors 5A and 5B, and the like. That is, each of the substrate supporting tables 10A and 10B is movably supported on a common fixed rail 3 which is provided on the base 2 and which extends in the Y-axis direction, and is configured so as to be respectively driven by the motors 5A or 5B via threaded shafts 4A or 4B. Based on motor control performed by a control unit 60, which will be described later, the first substrate supporting table 10A moves among positions: a receiving position where a substrate W fed from the first loader L1 can be received by the first substrate carry-in section En1; a sending position where the substrate W can be sent out from the first substrate carry-out section Ex1 to the conveyor pair CM1 of the downstream component mounting machine Mt; and the print position SP where screen printing is performed in a printing process. The second substrate supporting table 10B is configured so as to move among positions: a receiving position where a substrate W fed from the second loader L2 can be received by the second substrate carry-in section En1; a sending position where the substrate W can be sent out from the second substrate carry-out section Ex1 to the conveyor pair CM2 of the downstream component mounting machine Mt; and the print position SP where screen printing is performed in a printing process. For an alternate arrangement of the first substrate supporting table 10A and the second substrate supporting table 10B at the print position SP according to a predetermined order, one of the first substrate supporting table 10A and the second substrate supporting table 10B approaches the other substrate supporting table, and the other substrate supporting table recedes from the one substrate supporting table in the Y-axis direction. A rotary encoder is attached to the threaded shafts 4A and 4B. The control unit 60, which will be described later, is configured so as to be capable of acquiring positional information and velocity information of the corresponding substrate supporting tables 10A and 10B based on a detected value of the rotary encoders.

The respective substrate supporting tables 10A and 10B is provided with a belt conveyor pair 12A and 12B which extend in the X-axis direction, a clamp unit 14 which holds a substrate W on the belt conveyor pair 12A and 12B so as to be printable, a clamp unit drive mechanism for moving the clamp unit 14 in the X-axis direction along the belt conveyor pair 12A and 12B, and the like.

The belt conveyor pair 12A and 12B is made up of a belt conveyor. With respect to the substrate supporting table 10A, an upstream end of the belt conveyor in the X-axis direction constitutes the substrate carry-in section En1 and a downstream end of the belt conveyor in the X-axis direction constitutes the substrate carry-out section Ex1. With respect to the substrate supporting table 10B, an upstream end of the belt conveyor in the X-axis direction constitutes the substrate carry-in section En2 and a downstream end of the belt conveyor in the X-axis direction constitutes the substrate carry-out section Ex2. The belt conveyor is configured so as to receive a substrate W fed from the first loader L1 and the second loader L2 at the substrate carry-in sections En1 and En2 and convey the substrate W from the substrate carry-in sections En1 and En2 to a predetermined position set on the substrate supporting tables 10A and 10B (the foregoing will be referred to as a carry-in of a substrate), to convey the substrate W after the printing process to the substrate carry-out sections Ex1 and Ex2, and to convey the substrate W from the substrate carry-out sections Ex1 and Ex2 to the first and second belt conveyor pairs CL1 and CL2 of the component mounting machine Mt (the foregoing will be referred to as a carry-out of a substrate).

Referring to FIG. 2, each base member 140 of the substrate supporting tables 10A and 10B is supported on the fixed rail 3 so as to be movable in the Y-axis direction, and an X plate 141 is provided on each base member 140 so as to be movable in the X-axis direction with respect to the base member 140. Arm members 161 which respectively support the belt conveyor 12A (12B) are provided at both ends of the X plate 141 in the Y direction.

The clamp unit 14 is provided on the X plate 141 midway between both arm members 161 and comprises a backup mechanism which lifts up and supports a substrate W from the belt conveyor pair 12A and 12B and a clamp mechanism which is provided on the arm members 161 and which fixes the substrate W lifted up by the backup mechanism.

The backup mechanism is provided with a plurality of backup pins 151 in a predetermined arrangement and also includes a backup table 150 that is supported on the X plate 141 via a ball screw mechanism or the like so as to be ascendable/descendible and a motor 152 for driving the ball screw mechanism or the like. The ball screw mechanism or the like are activated by the motor 152, thereby the backup mechanism is adapted to displace the backup table 150 to a predetermined release position and a working position that is elevated from the release position. The release position here is a position where a tip position of the backup pin 151 is lower than a lower surface of a substrate W supported by the belt conveyor pair 12A and 12B (a position indicated in the substrate supporting table 10B on a right side of FIG. 2). The working position is a position where the tip position of the backup pin 151 is higher than the lower surface of the substrate W supported by the belt conveyor pair 12A and 12B (a position indicated in the substrate supporting table 10A on a left side of FIG. 2). Therefore, as shown on the left side of FIG. 2, the backup mechanism lifts the substrate W up from the belt conveyor pair 12A and 12B when the backup table 150 is arranged at the working position.

The clamp mechanism, arranged on the arm members 161 at a position above the belt conveyor pair 12A and 12B, includes a pair of clamp members 160 extending parallel to each other in the X-axis direction, and an actuator, such as a bidirectional air cylinder 162, for driving the clamp members. One of the two clamp members 160 is assembled onto the arm member 161 so as to be displaceable in the Y-axis direction and is displaced to a release position and a clamping position in the Y-axis direction by driving of the air cylinder 162. That is, the clamp mechanism is configured such that, when one clamp member 160 is displaced from the release position to the clamping position, the one clamp member 160 sandwiches and clamps the substrate W lifted up by the backup mechanism together with the other clamp member 160 in the Y-axis direction, and when the one clamp member 160 is displaced from the clamping position to the release position, the clamped substrate W is released.

The printing process is performed atop the substrate W which is held by the clamp unit 14 in such a way that the substrate W is lifted up from the belt conveyor pair 12A and 12B and is held by the clamp unit 161 that clamp the substrate W in the printing process as described above. The clamp unit 14 thus lifts up the substrate from the belt conveyor pair 12A and 12B and holds it in a state where screen printing by the print executing section 20 can be performed.

Each arm member 161 is formed so as to embrace the belt conveyor pair 12A and 12B from an outer side (an outer side in the Y-axis direction). One arm member 161 is fixed onto one end of the X plate 141, and the other arm member 161 is slidably provided on a fixed rail 164 that is fixed onto the X plate 141 along the Y-axis direction. Substrates W with various Y-direction widths of substrate can be available by adjusting a slide amount of the other arm member 161 to adjust conveyor width of the belt conveyor pair 12A and 12B. Furthermore, regardless of the conveyor width of the belt conveyor pair 12A and 12B that is adjusted according to the substrate width in the Y-direction, the substrate W can be accurately clamped regardless of substrate width in the Y-direction of the substrate W, by maintaining constant relative positions between the belt conveyor pair 12A and 12B and the respective clamp members 160.

Referring now to FIG. 2, the print executing section 20 is arranged at a predetermined position of the base 2 (in the example shown, an approximately central portion of the base 2) by a machine frame 6 formed in a gate shape. The print executing section 20 is provided with a screen mask holding mechanism, a squeegee unit holding mechanism 40, a squeegee unit 41 held by the squeegee unit holding mechanism 40, a squeegee drive mechanism (Y'-axis drive mechanism) which moves the squeegee unit 41 in a predetermined direction, and the like.

The screen mask holding mechanism includes a main body, the screen mask 21, a mask fixing member 22, a first lifting/lowering drive mechanism for lifting/lowering the mask fixing member 22, a rotation drive mechanism which rotates the main body of the screen mask holding mechanism together with the mask fixing member 22 in an R direction around the Z axis, and a second lifting/lowering drive mechanism which lifts/lowers the squeegee unit 41 with respect to the squeegee unit holding mechanism 40. As described below, a phase of the screen mask holding mechanism of the print executing section 20 is relatively changed in the radial R direction around the Z axis with respect to XY-axes coordinates of the respective substrate supporting tables 10A and 10B. Therefore, in the following description, such orthogonal coordinates with a relatively different phase will be expressed as "X', Y'".

The main body of the screen mask holding mechanism is movable in the R direction around the Z axis with respect to a frame (not shown) that is arranged on and fixed to the base 2. The main body is a structure for holding the screen mask 21 and the squeegee unit holding mechanism 40. The screen mask 21 and the rectangular mask fixing member 22 on which the screen mask 21 is detachably assembled are ascendable/descendible in the Z-axis direction with respect to the main body of the screen mask holding mechanism.

The screen mask 21 is provided with a print area having holes formed in correspondence with a circuit pattern to be printed on a substrate W.

The mask fixing member 22 is embodied by a rectangular frame in which an opening 22a for screen printing is formed at a center thereof. The screen mask 21 assembled onto the mask fixing member 22 in advance is fixed to the mask fixing member 22 so as to block the opening 22a.

The first lifting/lowering drive mechanism functions so that the mask fixing member 22 moves in a vertical direction (Z-axis direction) during a printing process to displace the screen mask 21 between an overlaying position where the screen mask 21 is overlaid on a substrate W, clamped and held by the substrate supporting tables 10A and 10B, and a release position set above the overlaying position.

The rotation drive mechanism is provided with a servo motor and a power transmitting mechanism (both not shown). As described above, the rotation drive mechanism rotates the main body of the screen mask holding mechanism together with the mask fixing member 22 in the R direction around the Z axis. Using the rotation drive mechanism, a phase of the screen mask 21 in the R direction can be finely adjusted with respect to a substrate W held by the substrate supporting table 10A (10B).

The second lifting/lowering drive mechanism is embodied by a ball screw mechanism, a servo motor, and the like, and lifts/lowers the squeegee 42 to a print position where the squeegee 42 comes into sliding contact with the screen mask 21 and a release position set above the print position. The screen mask holding mechanism holds the squeegee unit 41 up and down via the squeegee unit holding mechanism 40 and lifts/lowers the squeegee 42 between the print position and the release position using the second lifting/lowering drive mechanism.

The squeegee unit holding mechanism 40 is arranged so as to be movable in a Y'-axis direction with respect to an upper part of the main body of the screen mask holding mechanism (in a coordinate system set on the main body of the screen mask holding mechanism, and when an amount of rotational movement of the main body of the screen mask holding mechanism in the R-direction is 0, the Y'-axis direction is consistent with the Y-axis direction in a coordinate system set on the base 2), and holds the squeegee unit 41 so as to be ascendable/descendible in the Z-axis direction.

The squeegee unit 41 provided with the squeegee 42 which is ascendable/descendible in the Z-axis direction with respect to the squeegee unit holding mechanism 40 spreads a paste such as a cream solder or a conductive paste on the screen mask 21 while rolling (kneading) the paste. A squeegee angle variable mechanism (not shown) varies an inclination direction and an inclination angle of the squeegee 42 with respect to the screen mask 21, and the like.

The squeegee 42 is a rectangular plate-like member which is elongated in the X-axis direction and which is made of rigid urethane, stainless steel, or the like, and is assembled onto the squeegee unit 41.

The Y'-axis drive mechanism is provided with a motor 46 (refer to FIG. 3), a screw feeding mechanism which is rotationally moved by the motor 46 to cause the squeegee unit holding mechanism 40 to reciprocate in the Y'-axis direction, and the like. The Y'-axis drive mechanism drives the squeegee unit 41 in the Y'-axis direction together with the squeegee unit holding mechanism 40.

An imaging unit 50 is equipped with the print executing section 20. The imaging unit 50 is designed to perform image recognition of a relative positional relationship between the screen mask 21 and a substrate W. The imaging unit 50 is provided with two mask recognition cameras 50A which capture images of a plurality of markers including marks, symbols, and the like inscribed on a lower surface of the screen mask 21 from below, and two substrate recognition cameras 50B which capture images of a plurality of markers including marks, symbols, and the like of the substrate W supported by the substrate supporting tables 10A and 10B. Each mask recognition camera 50A is mounted on the main body of the screen mask holding mechanism so as to be movable in an X'-axis direction and the Y'-axis direction (directions of respective coordinate axes of the X'-Y' coordinate system set on the main body of the screen mask holding mechanism), and each substrate recognition camera 50B is fixed to the main body of the screen mask holding mechanism. Each mask recognition camera 50A is coupled to an X'-Y' robot (not shown) so as to be movable two-dimensionally. Based on control of the X'-Y' robot by the control unit 60 (to be described later), each mask recognition camera 50A enters a lower side of the screen mask 21 during preparation of the screen mask 21 or the like to capture images of the respective markers on the lower surface of the screen mask 21. Each substrate recognition camera 50B captures images of the respective markers on the substrate W when the substrate supporting table 10A (10B) is conveyed to the print executing section 20. Coordinates of positions of two markers (fiducial marks) of the screen mask 21 and positions of two markers (fiducial marks) on a substrate which have been recognized by both cameras 50A and 50B are converted from the X'-Y' coordinate system to the X-Y coordinate system on the base 2 based on an R-direction angle that is premised on an alignment of the screen mask 21 with the substrate W in the R-direction. Subsequently, a position of the screen mask 21 in the R-direction and an X-Y position of the substrate W are adjusted.

Figure 3:
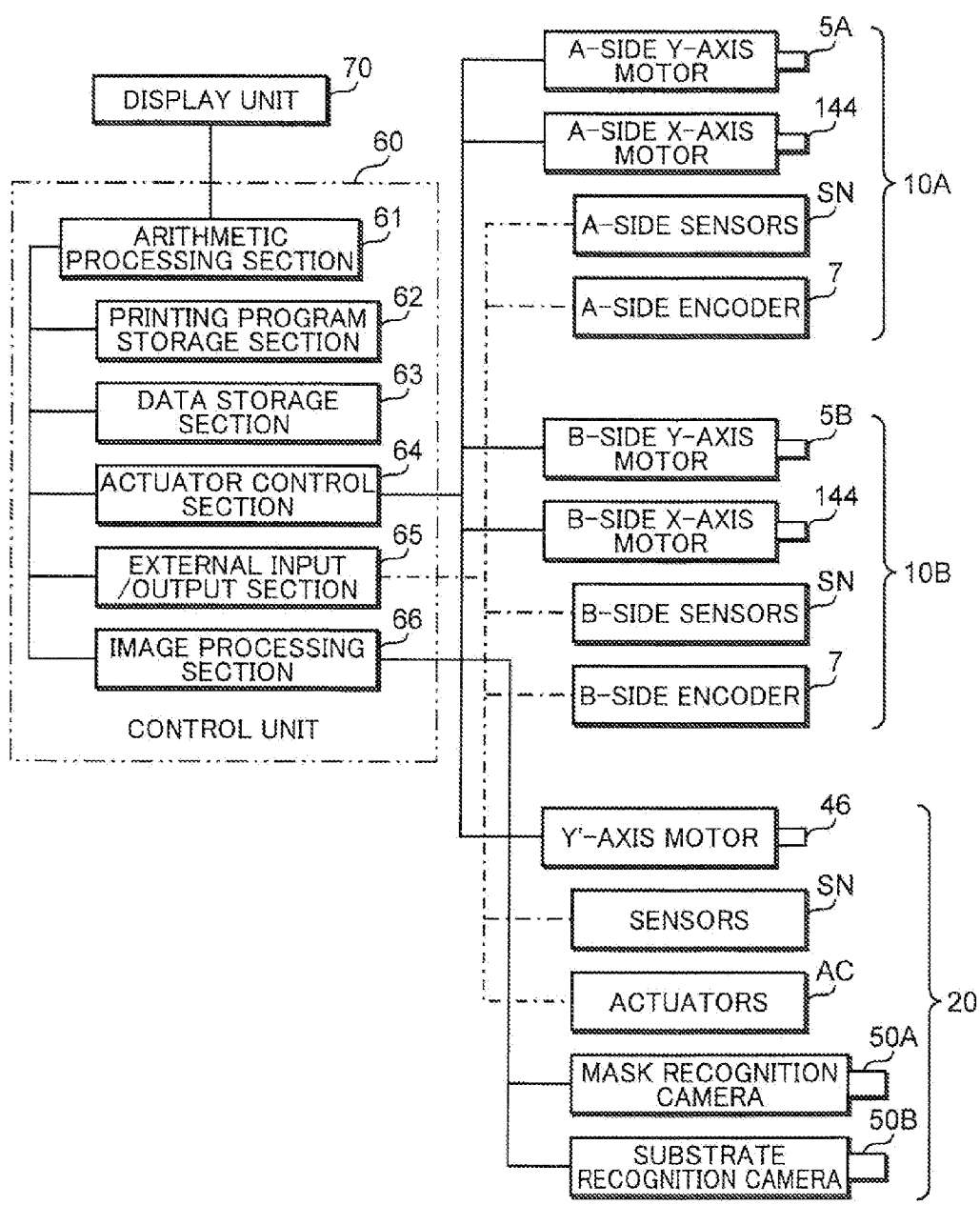
FIG. 3 is a block diagram showing a substantial part of the screen printing machine shown in FIG. 1.

As shown in FIG. 3, the control unit 60 (an example of control means according to the present disclosure) has an arithmetic processing section 61 constituted by a microprocessor or the like, a printing program storage section 62 which stores transaction data and the like for print processing, a data storage section 63 which stores master data and the like necessary for control, an actuator control section 64 which drives actuators such as the motors 5A and 5B, an external input/output section 65 constituted by various interfaces, and an image processing section 66 constituted by a capture board or the like. All of the actuators and cameras including the mask recognition camera 50A are electrically connected so as to be controllable by the control unit 60. Therefore, a series of print processing operations by the substrate supporting tables 10A and 10B and the print executing section 20 or, in other words, a series of operations including the reception of a substrate W fed from the first loader L1 and the second loader L2 by the substrate carry-in sections En1 and En1, screen printing on the substrate W, and the carrying-out of the substrate W from the substrate carry-out sections Ex1 and Ex1 is controlled overall by the control unit 60. In addition, a display unit 70 capable of displaying a processing state with a GUI or the like and an input machine (not shown) constituted by a pointing device or the like are connected to the control unit 60, and transaction data can be inputted and a program that realizes control processing can be set or changed through operations performed by an operator. Moreover, both the printing program storage section 62 and the data storage section 63 are logical concepts which are realized by combining a ROM, a RAM, an auxiliary storage device, and the like.

Next, a printing process of the screen printing machine 1 based on control by the control unit 60 will be described.

Figure 4:
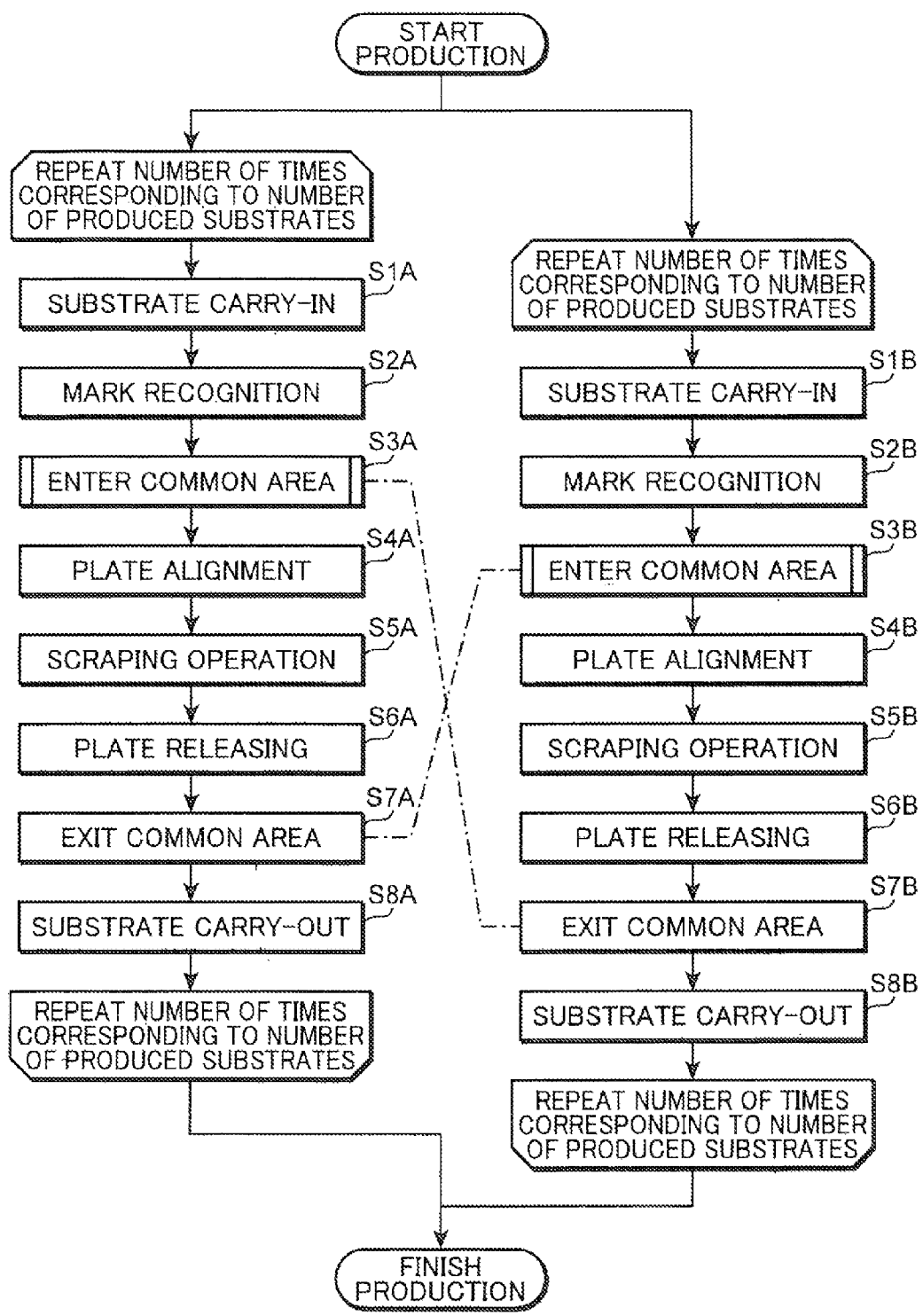
FIG. 4 is a flowchart showing a printing process of the screen printing machine shown in FIG. 1.

Referring now to FIG. 4, the control unit 60 respectively and independently actuates the first substrate supporting table 10A and the second substrate supporting table 10B. For each substrate supporting table, the control unit 60 executes the following steps repetitively, by a number of times corresponding to the number of substrates to be produced: carry-in of substrate (steps S1A and S1B); mark recognition (steps S2A and S2B); an entry subroutine of the substrate supporting tables 10A and 10B to the common area (steps S3A and S3B); plate alignment (adjustment of an X-direction position of a substrate W by adjusting an X-direction position of the X plate 141, adjustment of a Y-direction position of the substrate W by the motors 5A and 5B of the substrate supporting tables 10A and 10B, and an adjustment of an R-direction position of the screen mask 21 by adjusting an R-direction position of the main body of the screen mask holding mechanism with the rotation drive mechanism of the screen mask holding mechanism) (steps S4A and S4B); a scraping operation for scraping off cream solder (steps S5A and S5B); plate releasing operation (steps S6A and S6B); an exit operation of the substrate supporting tables 10A and 10B from the common area (steps S7A and S7B); and a carry-out operation for carrying out the printed substrate W after exit (steps S8A and S8B). Among the respective steps, steps from the entry subroutine (steps S3A and S3B) to the exit operation (steps S7A and S7B) constitute a narrowly-defined printing process. In addition, among the respective steps, mark recognition (steps S2A and S2B) includes processes such as "mark recognition" for recognizing markers on a substrate W, "bad mark recognition" for recognizing bad marks set on some of multiple-divided substrates W which are divided after mounting components, and "foreign object inspection" for inspecting foreign objects attached to a substrate W.

In the present embodiment, the two substrate supporting tables 10A and 10B are required to share the single print executing section 20 and alternately enter or exit the print position SP set in the common area. Therefore, as shown in FIGS. 5A to 5C and 6, an operation, in which one substrate supporting table 10A (10B) enters toward the print position SP at a predetermined entry velocity Vs, is synchronized with an operation in which the other substrate supporting table 10B (10A) exits the print position SP at a predetermined exit velocity Vp under a condition set in advance, thereby improving efficiency of a switching operation between the substrate supporting tables 10A and 10B.

Referring now to FIG. 6, in the present embodiment, in order to execute an operation in which one substrate supporting table 10A (10B) enters toward the print position SP "parallel" with an operation in which the other substrate supporting table 10B (10A) exits the print position SP, keeping a constant distance between both substrate supporting tables 10A and 10B to avoid the interference with one another, step S3A (or S3B) in FIG. 4 is synchronized with step S7B (or S7A). Accordingly, as shown in FIG. 6, the efficiency of a switching operation between the substrate supporting tables 10A and 10B is improved significantly. Here, the aforementioned "parallel" may encompass at least a partial overlap between a period during which one substrate supporting table 10A (10B) among the pair of substrate supporting tables enters toward the print position SP, and a period during which the other substrate supporting table 10B (10A) exits the print position SP. In other words, a timing at which entry is started need not necessarily be synchronized with a timing at which exit is started.

Next, a common area entry subroutine S3 in the flow chart shown in FIG. 4 will be described.

Figure 7:
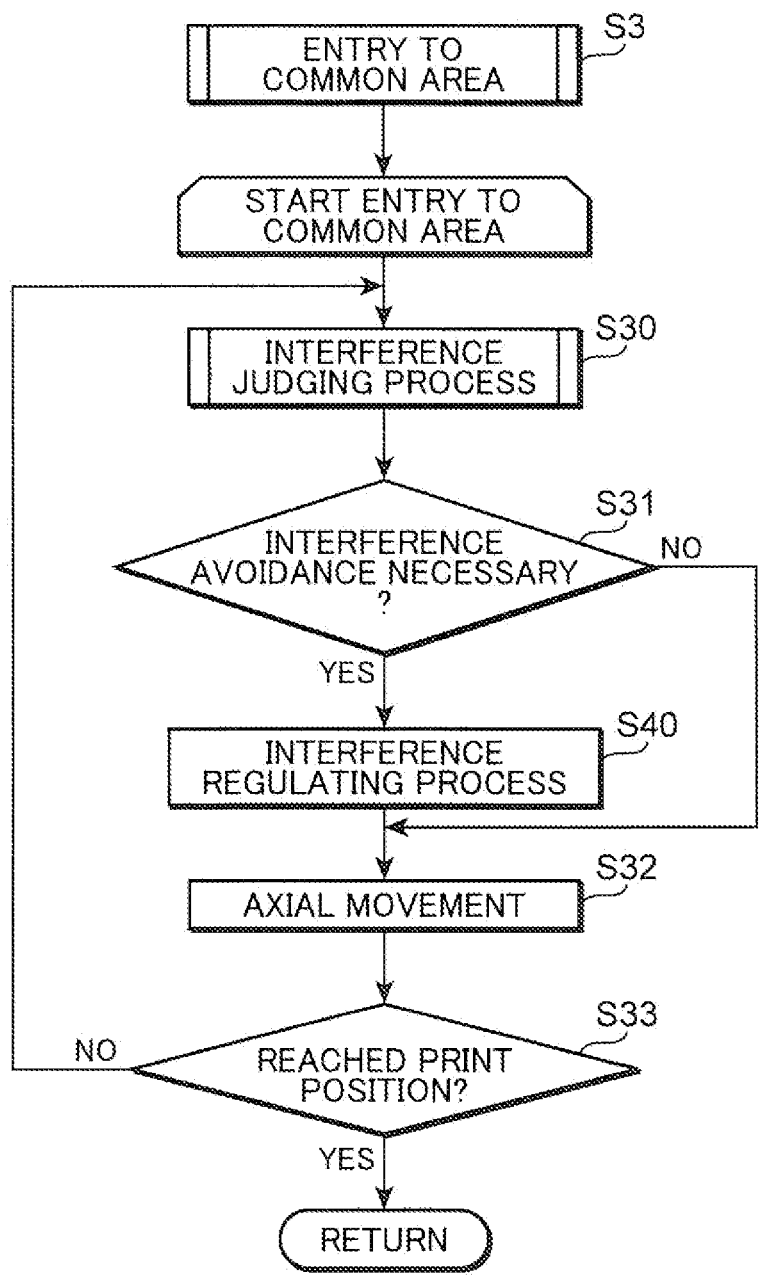
FIG. 7 is a flow chart showing a common area entry subroutine according to the flow chart shown in FIG. 4.

Referring now to FIG. 7, the common area entry subroutine S3 is for realizing operations shown in FIGS. 5A to 5C and 6. Before reaching the print position SP from the receiving position, the control unit 60 executes an interference judging process (step S30) and subsequently judges whether or not interference avoidance is necessary (step S31). If interference avoidance is necessary, the control unit 60 executes an interference regulating process (step S40) and subsequently executes a movement in the Y-axis direction (also referred to as an axial movement) (step S32). For the axial movement, an entry velocity Vs of a corresponding substrate supporting table 10A or 10B is set based on a distance from the receiving position to the print position SP. A rotational speed of the motor 5A (5B) of the threaded shaft 4A (4B) is determined. The motor 5A (5B) is then driven. Accordingly, the two substrate supporting tables 10A and 10B can be efficiently and alternately conveyed from the receiving position to the print position SP to perform a printing process. Incidentally, since the substrate supporting table driving mechanism which conveys the substrate supporting tables 10A and 10B in the Y-axis direction employs the threaded shafts 4A and 4B and the motors 5A and 5B which share the same specifications, no interference would occur between the two substrate supporting tables 10A and 10B, provided that an entry and an exit are simultaneously executed at a same velocity while maintaining a predetermined interval. However, there are cases where respective movement velocities differ from each other or an opposing interval varies for some reason. Therefore, in such a case, the present embodiment is configured so as to execute the interference judging process of step S30, judge whether or not interference avoidance is necessary (step S31), and if necessary, execute the interference regulating process of step S40. Moreover, a determination of whether or not the print position SP has been reached is made while axial movement is in progress (step S33). If the print position SP has not been reached, a return is made once again to the interference judging process in step S30, and if the print position SP has been reached, a transition is made to plate alignment (steps S4A and S4B) in the main flow shown in FIG. 4.

Figure 8:
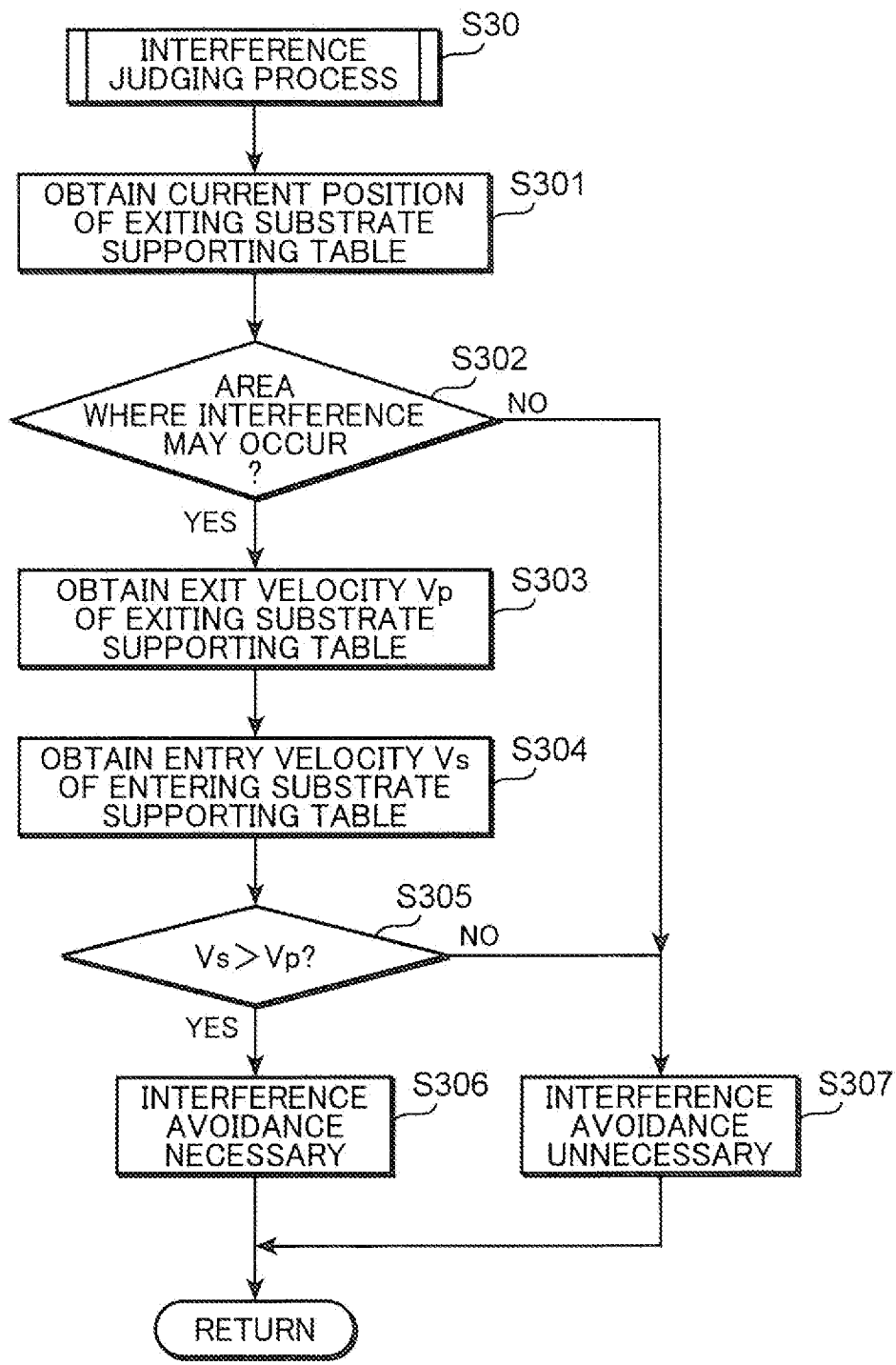
FIG. 8 is a flowchart showing an interference judging process subroutine according to the flow chart shown in FIG. 7.

Referring now to FIG. 8, in the subroutine for executing the interference judging process of step S30, the control unit 60 first obtains a current position of the substrate supporting table 10A (10B) exiting from the print position SP (step S301), and judges whether or not the substrate supporting table 10A (10B) is in an area where interference may occur (step S302).

If the exiting substrate supporting table 10A (10B) is in an area where interference may occur, the control unit 60 further obtains an exit velocity Vp of the exiting substrate supporting table 10A (10B) and an entry velocity Vs of the substrate supporting table 10B (10A) making an entry toward the print position SP (steps S303 and S304), and compares the velocities (step S305). If the entry velocity Vs is higher than the exit velocity Vp, the control unit 60 judges that interference avoidance is necessary (step S306). If the entry velocity Vs is equal to or lower than the exit velocity Vp, the control unit 60 judges that interference avoidance is unnecessary (step S307). When it is judged in S302 that the exiting substrate supporting table 10A (10B) is not within an area where interference may occur, the control unit 60 also judges that interference avoidance is unnecessary (step S307). In this case, an "area where interference may occur" refers to a region that is dynamically set based on a movement velocity difference and an opposing interval between both substrate supporting tables 10A and 10B in a region that occupies the print position SP. A calculation formula or a map for deciding an "area where interference may occur" is stored in advance in the data storage section 63 of the control unit 60.

The control unit 60 makes a judgment on whether or not interference avoidance is necessary through the process described above and then returns to the common area entry subroutine S3 shown in FIG. 7.

Next, the interference regulating process subroutine S40 of the common area entry subroutine S3 will be described. The interference regulating process subroutine S40 can be realized in several modes.

A first mode is a method of avoiding interference by velocity control.

Figure 9:
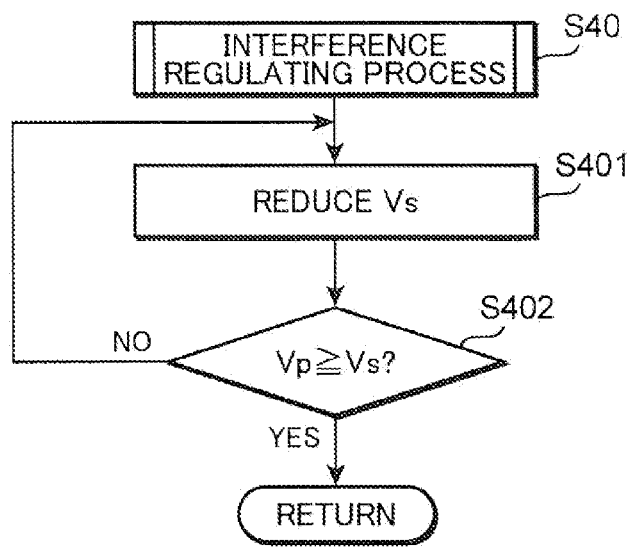
FIG. 9 is a flow chart showing a mode (velocity control) of an interference regulating process subroutine according to the flow chart shown in FIG. 7.

Referring now to FIG. 9, in a case where interference is avoided by velocity control, the control unit 60 reduces an entry velocity Vs of the substrate supporting table 10B (10A) that is going to enter the print position SP (step S401) and controls the entry velocity Vs so as to be equal or below an exit velocity Vp of the substrate supporting table 10A (10B) exiting the print position SP (step S402). According to this control method, the substrate supporting table 10B (10A) entering the print position SP can be regulated from interfering with the substrate supporting table 10A (10B) exiting the print position SP.

A second mode is a method of controlling an opposing interval.

Figure 10:
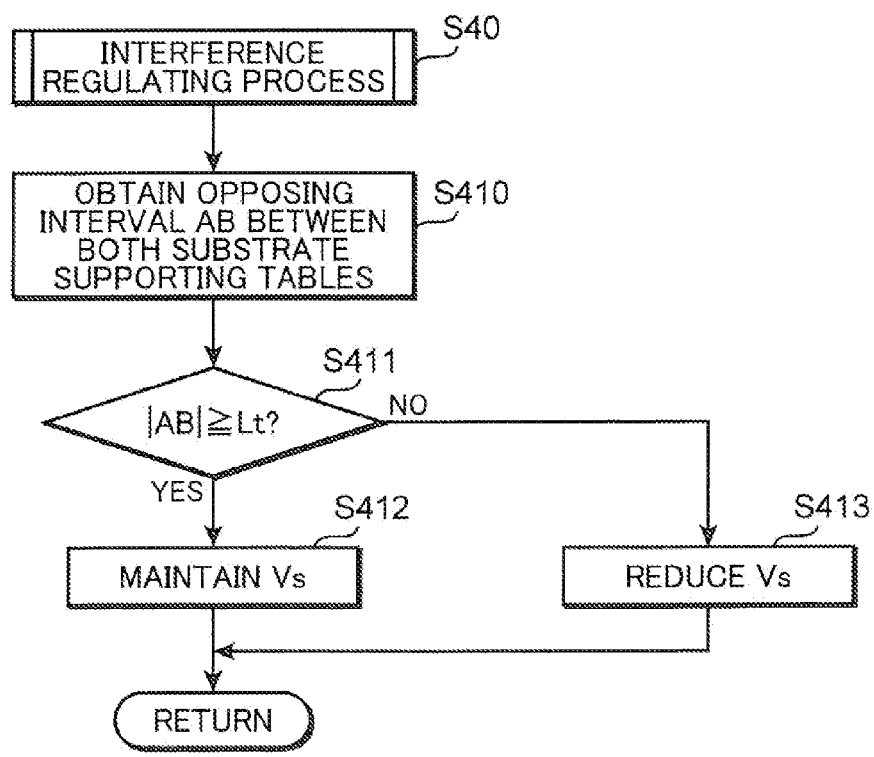
FIG. 10 is a flow chart showing another mode (interval control) of the interference regulating process subroutine according to the flow chart shown in FIG. 7.

Referring now to FIG. 10, in a case where controlling the opposing interval, a threshold Lt of the opposing interval is set in advance and stored in the data storage section 63. Then, an opposing interval between the substrate supporting tables 10A and 10B is obtained (computed) (step S410) and a length comparison between the threshold Lt and the opposing interval is executed (step S411). The threshold Lt may be a constant. However, it also may be a variable that is varied depending on an entry velocity Vs and an exit velocity Vp. In particular, a period during which the opposing interval decreases varies depending on a relative relationship between the entry velocity Vs and the exit velocity Vp (the greater a velocity difference obtained by subtracting the exit velocity Vp from the entry velocity Vs, the shorter the period). Therefore, a value that takes a variation thereof, a safety factor with respect to inertia, or the like is preferably set (the shorter the period, the greater the threshold Lt to be set).

If the opposing interval is equal to or greater than the threshold Lt, the entry velocity Vs of the substrate supporting table 10B (10A) proceeding to the print position SP is maintained (step S412). On the other hand, if the opposing interval is smaller than the threshold Lt, the entry velocity Vs of the substrate supporting table 10B (10A) proceeding to the print position SP is reduced (step S413). A degree by which the entry velocity Vs is reduced may be varied according to a difference between the opposing interval and the threshold Lt (the smaller the difference between the opposing interval and the threshold Lt, the greater the degree by which the velocity is reduced) or may be set uniformly. In any mode, the entry velocity Vs may be set to 0. That is, a stationary mode may be included. In this manner, by comparing the opposing interval with the threshold Lt, the substrate supporting table 10B (10A) entering the print position SP can be regulated from interfering with the substrate supporting table 10A (10B) exiting the print position SP.

A third mode is a method of controlling a movement timing.

Figure 11:
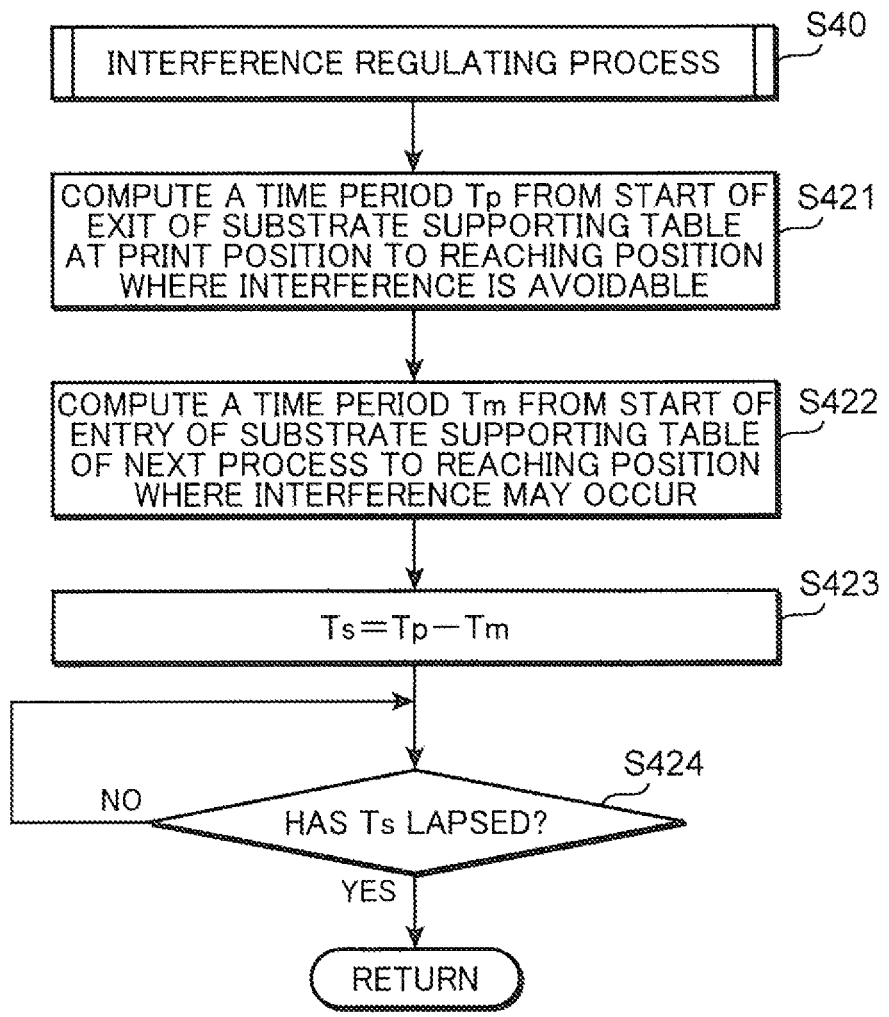
FIG. 11 is a flow chart showing yet another mode (time control) of the interference regulating process subroutine according to the flow chart shown in FIG. 7.

Referring now to FIG. 11, in a case of controlling a movement timing, first, a time period Tp from the start of exit of the substrate supporting table 10A (10B) at the print position SP to reaching a position where interference is avoidable and a time period Tm from the start of entry of the substrate supporting table 10B (10A) in standby for a next printing process to the substrate supporting table 10B (10A)

reaching a position where interference may occur are computed (steps S421 and S422). In general, a "position where interference is avoidable" refers to a position where the exiting substrate supporting table 10A (10B) has exited from the print position SP. However, when considering the exit velocity Vp and the entry velocity Vs of the substrate supporting tables 10A and 10B, a "position where interference is avoidable" need not necessarily be a position reached after exiting the print position SP and may be dynamically set according to the exit velocity Vp and the entry velocity Vs to, for example, "an area reached when exiting an area of the print position SP by n %". In a similar manner, a "position where interference may occur" is not limited to the entire area inside the print position SP and may be dynamically and restrictively set according to the entry velocity Vs and the exit velocity Vp to, for example, "an area reached when entering the print position SP by m %".

Next, a difference Ts between both time periods Tp and Tm is computed (step S423), and come to a halt (a movement timing is delayed) until the difference Ts has lapsed from the start of exit of the substrate supporting table 10A (10B) at the print position SP (step S424). Even with this mode in which, instead of a complete synchronization where the respective periods of entry and exit are completely conformed to each other, entry and exit are performed in parallel in parts of the respective periods, the efficiency of substrate printing can be improved (a throughput value which indicates the number of substrates W on which printing can be executed and which can be carried out from the print screen printing machine 1 to the downstream component mounting machine Mt within a predetermined period of time is increased) and, at the same time, the substrate supporting table 10B (10A) entering the print position SP can be regulated from interfering with the substrate supporting table 10A (10B) exiting the print position SP.

The respective subroutines shown in FIGS. 9 to 11 are selected according to the model, operating conditions, and the like of the screen printing machine 1. Alternatively, all of the subroutines may be stored in advance in the control unit 60 and configured so as to be selectable automatically or manually from one subroutine to another during installation or operation of the screen printing machine 1.

On the contrary, when the opposing interval between the two substrate supporting tables 10A and 10B is sufficiently wide, an interference is less likely to occur. However, there is a risk that switching from a printing process of one of the substrate supporting tables to a printing process of the other substrate supporting table may be time consuming. Therefore, depending on the mode of the screen printing machine 1, the control shown in FIG. 12 may be adopted instead of the control shown in FIG. 4.

Figure 12:
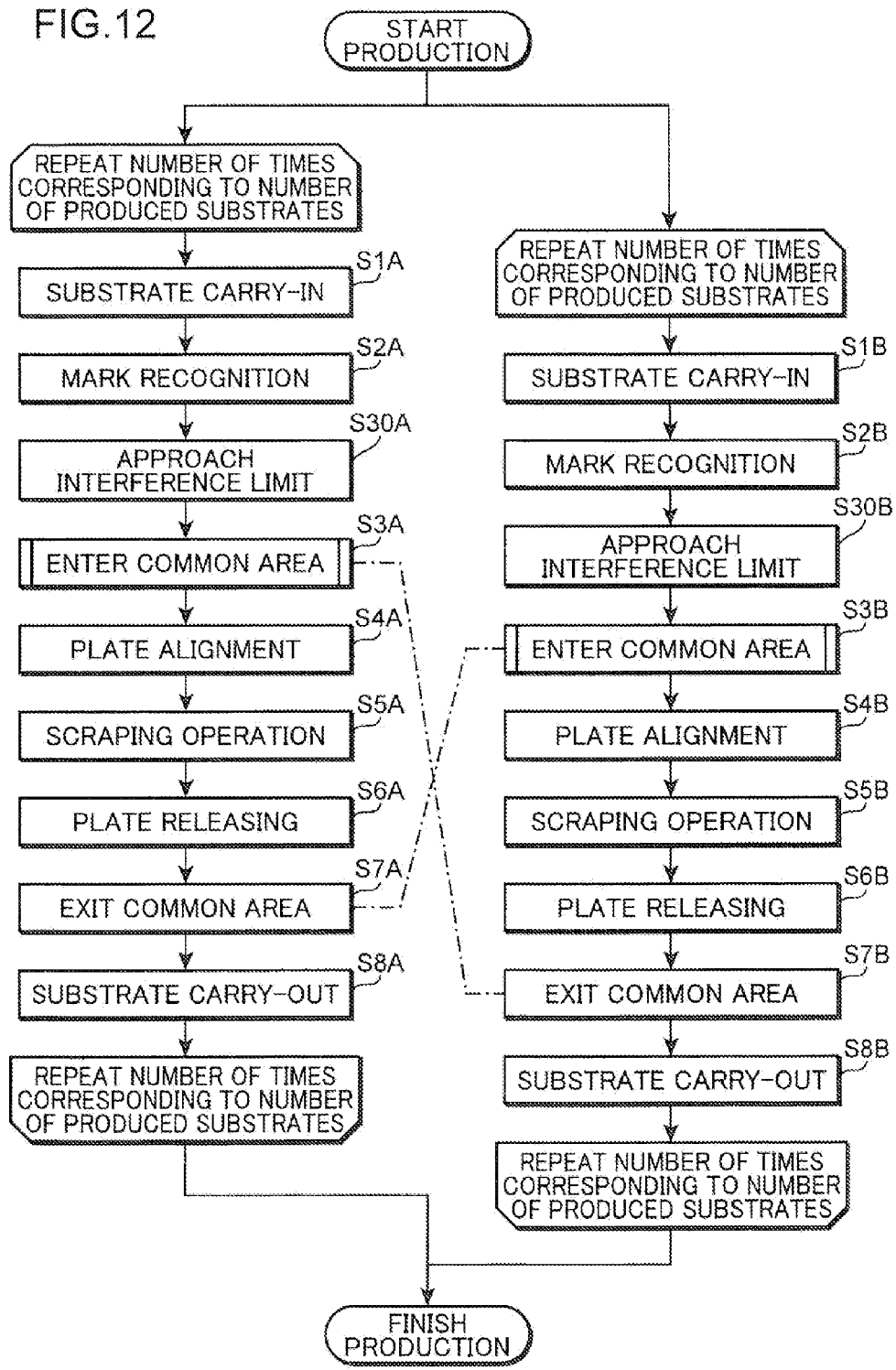
FIG. 12 is a flow chart showing a modification of FIG. 4.

Referring now to FIG. 12, in the control mode shown in this figure, an interference limit approaching operation (steps S30A and S30B), by which the substrate supporting table 10B (10A) that is in standby for a printing process approaches the substrate supporting table 10A (10B) at the print position SP up to an interference limit, is executed between the mark recognition operation (steps S2A and S2B) and the common area entry operation (steps S3A and S3B).

Figure 13A:
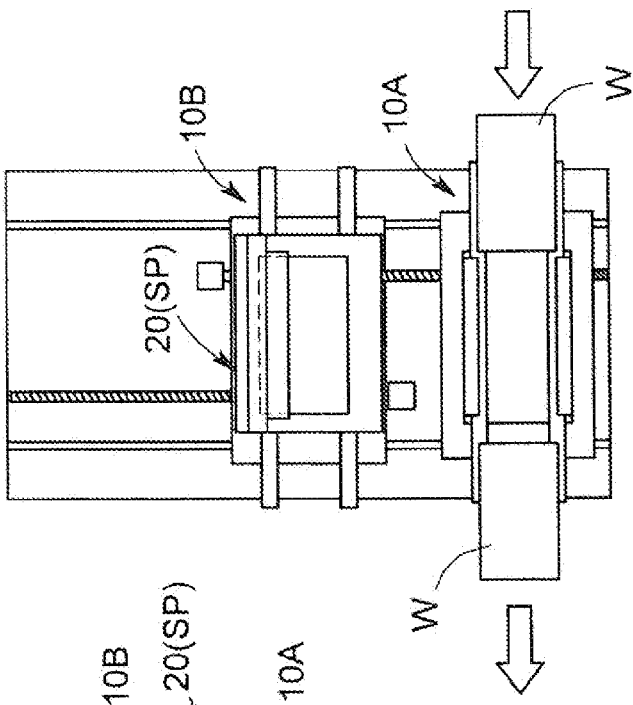
FIGS. 13A through 13C are diagrams showing an operational procedure for alternate printing based on the flow chart shown in FIG. 12.
Figure 13B:
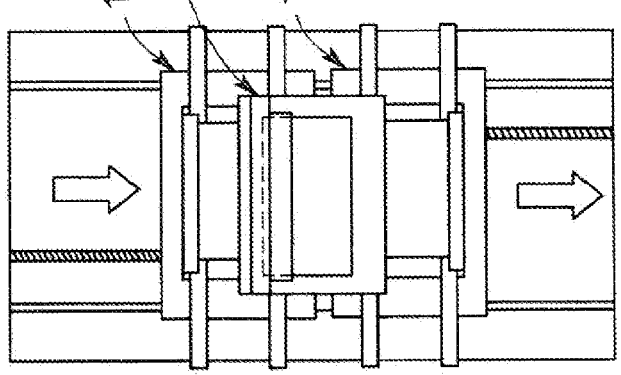
Figure 13C:
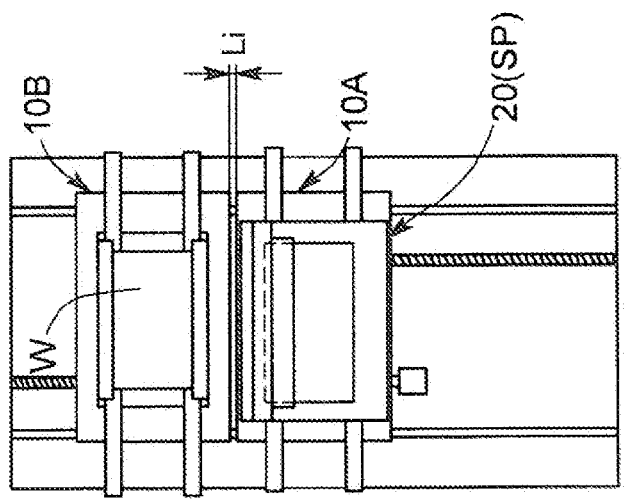
Figure 14:
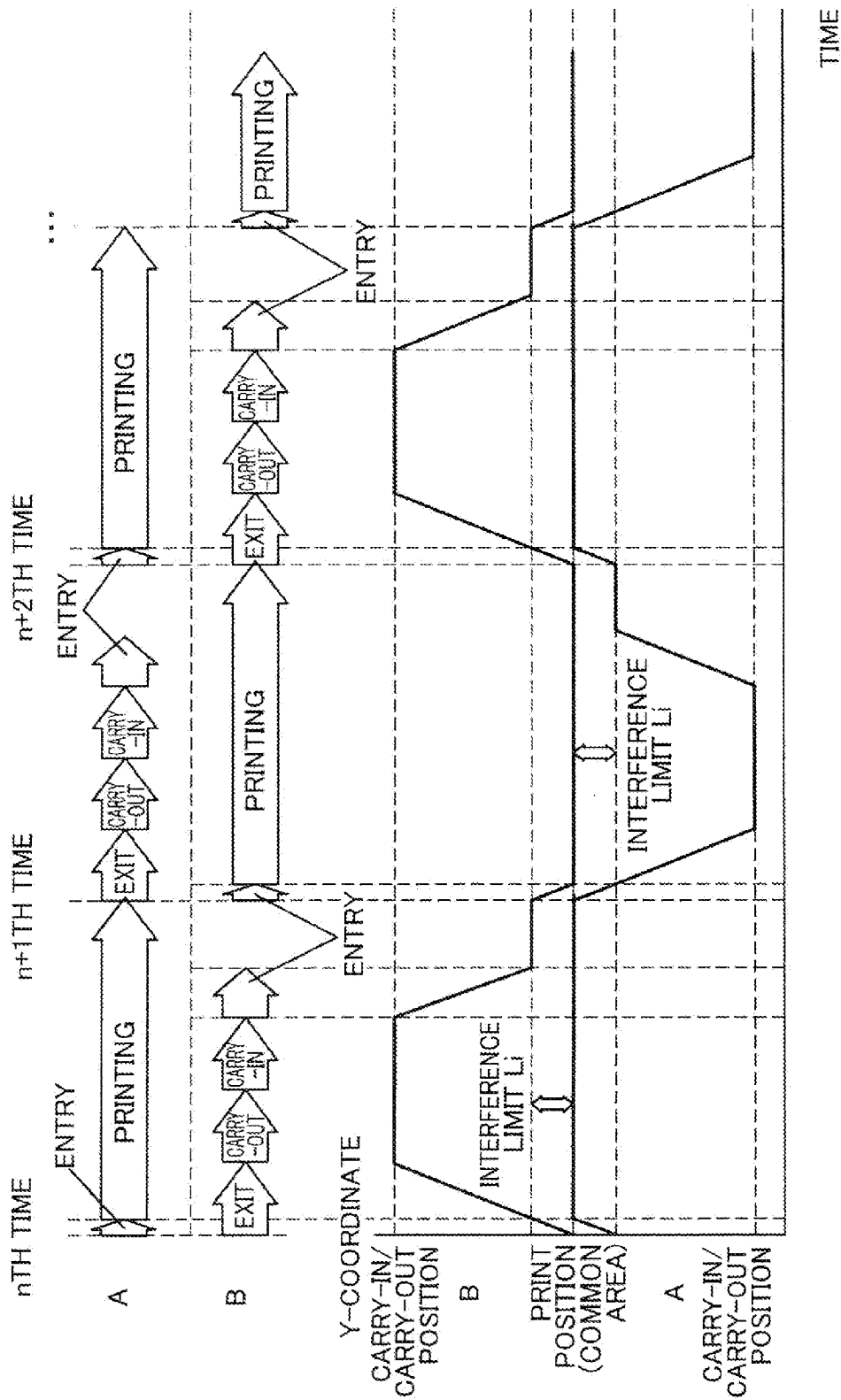
FIG. 14 is a timing chart of alternate printing based on the flow chart shown in FIG. 12.

Referring now to FIG. 13, an interference limit Li refers to a minimum distance to which the two substrate supporting tables 10A and 10B can approach each other without causing interference. When this mode is adopted as shown in FIG. 14, the substrate supporting table 10B (10A) which has completed carry-in of a substrate W and which is in standby for a printing process is in standby for printing in a state where the substrate supporting table 10B (10A) has approached the substrate supporting table 10A (10B) as much as practicable. Therefore, when entry of the substrate supporting table 10B (10A) which transitions to a printing process is performed in parallel after exit of the substrate supporting table 10B (10A) which has been finished a printing process is started, a parallel operation can be performed while maintaining the opposing interval between the two substrate supporting tables 10A and 10B at the interference limit Li. As a result, a time interval from the start of exit to a transition to a next printing process can be minimized and alternate printing by the two substrate supporting tables 10A and 10B can be realized in a short period of time and in an efficient manner. Incidentally, a part of an entry period from the receiving position of one of the substrate supporting tables 10A and 10B to the print position SP is performed in parallel with printing at the other substrate supporting table, which also contributes to improving substrate printing efficiency.

In the modes shown in FIGS. 12 to 14, an exit operation and an entry operation can also be performed in parallel while avoiding interference by using the common area entry subroutine S3 shown in FIG. 7 or the interference judging process subroutine S30. As a specific method of interference avoidance, the interference regulating process subroutine S40 shown in FIGS. 9 and 11 can be adopted. Also, by setting the threshold Lt to the interference limit Li, the interference regulating process subroutine S40 shown in FIG. 10 can be adopted.

As described above, according to the present embodiment, since one print executing section 20 is shared by the pair of substrate supporting tables 10A and 10B and screen printing can be alternately performed, redundancy of the print executing section 20 can be avoided. Therefore, in cases where substrates W of a same type are consecutively produced by both substrate supporting tables 10A and 10B, a single screen mask 21 can be shared and a cost for the screen mask 21 can be cut in half. In addition, since a single screen mask 21 can be shared, solder necessary for preparation is kept to a necessary and sufficient amount. Therefore, cost reduction can also be achieved in post-production treatment (disposal, storage, and the like) of solder. Furthermore, since redundancy of the print executing section 20 has been eliminated and a print position SP of the print executing section 20 is set in a common area of the pair of substrate supporting tables 10A and 10B, movement distances of the respective substrate supporting tables 10A and 10B in the Y-axis direction can be overlapped by an amount corresponding to the common area. As a result, a space for arranging the print executing section 20 and a movement range of the substrate supporting tables 10A and 10B can be kept compact and, in turn, the machine itself as well as accompanying conveyors can be downsized. Moreover, when the printing process is repeated alternately, since a substrate supporting table 10A or 10B that is in standby among the pair of substrate supporting tables 10A and 10B starts its entry to a print position SP at a timing when the counterpart substrate supporting table 10A or 10B at the print position SP which has completed the printing process starts its exit of the print position SP, a switching operation between the substrate supporting tables 10A and 10B may be expedited as much as practicable and processing efficiency may be improved (the throughput value described earlier may be increased).

In addition, in the present embodiment, the control unit 60 controls the substrate supporting table driving mechanism so that, after carrying out a printed substrate W and before moving into a next printing process, one substrate supporting table 10A or 10B that has exited the print position SP approaches the counterpart substrate supporting table 10A or 10B located at the print position SP, up to an interference limit set in advance. Therefore, in the present embodiment, since the substrate supporting table 10A or 10B that has exited the print position SP approaches the counterpart substrate supporting table 10A or 10B after the exit, a period of time until completion of entry when the substrate supporting table 10A or 10B once again enters the print position SP in a next printing process can be reduced as much as practicable. As a result, a total processing time can be further reduced and processing efficiency can be improved.

Furthermore, in the present embodiment, the control unit 60 logically includes interference avoidance necessity judging means for judging whether or not it is necessary to avoid interference between the substrate supporting table 10B (10A) entering the print position SP, and the substrate supporting table 10A (10B) exiting the print position SP is required and regulating means for regulating interference between the two substrate supporting tables 10A and 10B when the interference avoidance necessity judging means judges that interference avoidance is necessary. Therefore, in the present embodiment, since the pair of substrate supporting tables 10A and 10B can be moved in parallel so that the substrate supporting tables 10A and 10B do not interfere with each other, switching of printing processes from one substrate supporting table 10A (10B) to the other substrate supporting table 10B (10A) can be realized in a shorter period of time.

In addition, in a mode of the present embodiment, the control unit 60 as the regulating means determines a movement velocity of the substrate supporting table 10B (10A) entering the print position SP according to a difference between an entry velocity Vs of the substrate supporting table 10B (10A) entering the print position SP, and an exit velocity Vp of the substrate supporting table 10A (10B) exiting the print position SP. Therefore, in the present embodiment, interference avoidance between the substrate supporting tables 10A and 10B can be realized based on a movement velocity which can be readily obtained from a control system or a sensor system of the substrate supporting table driving mechanism.

Furthermore, in the present embodiment, the control unit 60 constituting regulating means determines the entry velocity (movement velocity) Vs of the substrate supporting table 10B (10A) entering the print position SP according to an opposing interval between the substrate supporting table 10B (10A) entering the print position SP, and the substrate supporting table 10A (10B) exiting the print position SP. Therefore, in the present embodiment, interference avoidance between the substrate supporting tables can be realized based on an opposing interval. The "opposing interval" is not limited to a constant but is preferably a dynamic value set based on a difference between the entry velocity Vs and the exit velocity Vp of the substrate supporting tables 10A and 10B. In this case, the greater the difference between the entry velocity Vs and the exit velocity Vp is, the greater but necessary and sufficient an opposing interval can beset as a threshold Lt in order to achieve interference avoidance according to a movement status of the substrate supporting tables 10A and 10B.

In addition, in a mode of the present embodiment, the control unit 60 as the regulating means computes an exit time period Tp from the start of exit of the substrate supporting table 10A (10B) that has finished a printing process until moving to a position where interference is avoidable, and an entry time period Tm from the start of entry of the substrate supporting table 10B (10A) that moves into a next printing process until moving to a position where interference may occur, thereby starting movement of the substrate supporting table 10B (10A) entering the print position SP when a difference time period Ts between the exit time period Tp and the entry time period Tm has lapsed. Therefore, in the present embodiment, the substrate supporting table 10B (10A) that is going to enter the print position SP can be moved to approach the substrate supporting table 10A (10B) exiting the print position SP as much as practicable while avoiding interference between the substrate supporting tables 10A and 10B. As a result, switching of printing processes from the substrate supporting table 10A or 10B that has finished a printing process to the substrate supporting table 10A or 10B that moves into a next printing process can be expedited while avoiding interference. That is, processing efficiency can be increased, by starting entry to the print position SP of the other substrate supporting table 10A or 10B before the printing process of the one substrate supporting table 10A or 10B is finished.

As shown, the present disclosure provides a screen printing machine comprising: a pair of substrate supporting tables, each of which is provided for holding a substrate that is a print object, the substrate supporting tables being juxtaposed along a specific direction that is perpendicular to a conveying direction of the substrate; a printing executing section that performs a printing process, at a print position set in a common area in which both of the substrate supporting tables are movable in the specific direction, alternately on the substrate held by each of the substrate supporting table; a substrate supporting table driving mechanism that individually drives the pair of substrate supporting tables in the specific direction; and control means for controlling the substrate supporting tables driving mechanism so that one of the substrate supporting tables that moves into a printing process enters the print position by moving in a direction approaching the counterpart substrate supporting table along the specific direction, while the other substrate supporting table that has completed the printing process at the print position exits the print position by moving in a direction receding from the counterpart substrate supporting table along the specific direction, wherein the control means controls the substrate supporting table driving mechanism so that one substrate supporting tables completes entry to the print position after the counterpart substrate supporting table stayed at the print position completes the exit of the print position, in away that at least parts of an exit period for the substrate supporting table to exit the print position and an entry period for the counterpart substrate supporting table to entry to the print position overlap each other. According to this mode, since one print executing section is shared by a pair of substrate supporting tables and screen printing can be alternately performed, redundancy of the print executing section can be avoided. Therefore, in cases where substrates of a same type are consecutively produced by both substrate supporting tables, a single screen mask can be shared and a cost for screen masks can be cut in half. In addition, since a single screen mask can be shared, solder necessary for preparation is kept to a necessary and sufficient amount. Therefore, cost reduction can also be achieved in post-production treatment (disposal, storage, and the like) of solder. Furthermore, since redundancy of the print executing section has been eliminated and a print position of the print executing section is set as a common area of the pair of substrate supporting tables, movement distances of the respective substrate supporting tables in a specific direction can be overlapped by an amount corresponding to the common area. As a result, a space for arranging the print executing section and a movement range of the substrate supporting tables can be kept compact and, in turn, the machine itself as well as accompanying conveyors can be downsized. Moreover, when the printing process is alternately repeated, since the substrate supporting table driving mechanism is controlled so that one substrate supporting tables completes entry to the print position after the counterpart substrate supporting table stayed at the print position completes exit the print position, and at least parts of an exit period for the substrate supporting table to exit the print position and an entry period for the counterpart substrate supporting table to entry to the print position overlap each other, a switching operation between substrate supporting tables is expedited as much as practicable and processing efficiency is improved.

Therefore, according to the present disclosure, since a pair of substrate supporting tables share a single print executing section, only one screen mask is required for the pair of substrate supporting tables. Consequently, since there is no need to create unnecessary screen masks and, at the same time, loss of solder used in production can be reduced, cost reduction can be achieved. In addition, since the two substrate supporting tables have an area that can be shared, print positions can be overlapped with each other as a common area and downsizing of the machine can be expected. Furthermore, when alternately repeating the printing process, since at least parts of an exit period of one substrate supporting table from the print position and an entry period for the counterpart substrate supporting table to enter to the print position overlap each other, a switching operation between the substrate supporting tables may be expedited as much as practicable and processing efficiency may be improved. Therefore, according to the present disclosure, a prominent advantageous effect is produced in which an inexpensive small-sized screen printing machine which has low redundancy and high production efficiency and which is applicable to a dual conveying-type component mounting machine can be provided.

Ina preferable mode, the control means controls the substrate supporting table driving mechanism so that, during the time after carrying out a printed substrate and before moving into a next printing process, one substrate supporting table which has exited the print position approaches the counterpart substrate supporting table located at the print position by an interference limit set in advance. The "interference limit" refers to a minimum distance to which the two substrate supporting tables can approach each other without causing interference. In this mode, since the substrate supporting table that has exited the print position approaches the counterpart substrate supporting table after the exit, a period of time until completion of entry when the substrate supporting table once again enters the print position in a next printing process can be reduced as much as practicable. As a result, a total processing time can be further reduced and processing efficiency can be improved.

In a preferable mode, the control means includes interference avoidance necessity judging means for judging whether or not it is necessary to avoid interference between the substrate supporting table entering the print position, and the substrate supporting table exiting the print position, and regulating means for regulating interference between the two substrate supporting tables when the interference avoidance necessity judging means judges that interference avoidance is necessary. In this mode, since the pair of substrate supporting tables can be moved in parallel so that the substrate supporting tables do not interfere with each other, switching of printing processes from one substrate supporting table to the other substrate supporting table can be realized in a shorter period of time.

In a preferable mode, the regulating means determines a movement velocity of the substrate supporting table entering the print position according to a difference between a movement velocity of the substrate supporting table entering the print position, and a movement velocity of the substrate supporting table exiting the print position. In this mode, interference avoidance between the substrate supporting tables can be realized based on a movement velocity which can be readily obtained from a control system or a sensor system of the substrate supporting table driving mechanism.

In a preferable mode, the regulating means determines the movement velocity of the substrate supporting table entering the print position according to an opposing interval between the substrate supporting table entering the print position, and the substrate supporting table exiting the print position. In this mode, interference avoidance between the substrate supporting tables can be realized based on an opposing interval. The "opposing interval" is not limited to a constant but is preferably a dynamic value set based on a difference between movement velocities of the substrate supporting tables. In such a case, a necessary and sufficient opposing interval can be set as a threshold according to a movement status of the substrate supporting tables in order to achieve interference avoidance.

In a preferred mode, the regulating means computes an exit time period from the start of exit of the substrate supporting table that has been finished the printing process until moving to a position where interference is avoidable, and an entry time period from the start of entry of the substrate supporting table that moves into a next printing process until moving to a position where interference may occur, thereby starting movement of the substrate supporting table entering the print position when a difference between the exit time period and the entry time period has lapsed. When the substrate supporting table entering the print position moves, say, faster than the substrate supporting table exiting the print position, the opposing interval between the substrate supporting tables would decrease with time and eventually be 0 when a predetermined amount of time has lapsed from the start of movement. In this mode, however, by computing an exit time period from the start of the exiting of the substrate supporting table that has finished a printing process until moving to a position where interference is avoidable, and an entry time period from the start of entry of the substrate supporting table that moves into a next printing process until moving to a position where interference may occur, and starting movement of the substrate supporting table entering the print position when a difference between the exit time period and the entry time period has lapsed, the substrate supporting table that is going to enter the print position can be moved to approach the substrate supporting table that is exiting the print position as much as practicable while avoiding interference between the substrate supporting tables. As a result, switching of printing processes from the substrate supporting table that has finished a printing process to the substrate supporting table that moves into a next printing process can be expedited while avoiding interference.

In a preferred mode, the control means computes an exit time period from the start of exit to the completion of exit of the substrate supporting table that has finished the printing process and an entry time period from the start of entry to the completion of entry to the print position of the substrate supporting table that moves into a next printing process, and starts entry of one substrate supporting table when a difference between the exit time period and the entry time period has lapsed from the start of the exiting of the other substrate supporting table. When the substrate supporting table entering the print position moves, say, faster than the substrate supporting table exiting the print position, the opposing interval between the substrate supporting tables would decrease with time and eventually be 0 when a predetermined amount of time has lapsed from the start of movement. Even in such a case, by computing an exit time period from the start of exit to the completion of exit (in other words, the completion of a movement to a position where interference is avoidable) by the substrate supporting table that has finished a printing process and an entry time period from the start of entry to the completion of entry to the print position of the substrate supporting table that moves into a next printing process, and starting movement of the other substrate supporting table when a difference between the exit time period and the entry time period has lapsed from the start of exit of the one substrate supporting table, the substrate supporting table that is going to enter the print position can be moved to approach the substrate supporting table that is exiting the print position as much as practicable while avoiding interference between the substrate supporting tables. As a result, switching of printing processes from the substrate supporting table that has finished a printing process to the substrate supporting table that moves into a next printing process can be expedited while avoiding interference.

The screen printing machine 1 described above exemplifies a preferred embodiment of the present disclosure and a specific configuration thereof may be modified as appropriate without departing from the scope of the present disclosure.

For example, in a case of controlling a movement timing, a period from the start of the exiting to the completion of the exiting from the print position SP by a substrate supporting table 10A (10B) that has finished a printing process may be computed as an exit time period. A period from the start of entry to the completion of entry to the print position SP by a substrate supporting table 10B (10A) that moves into a next printing process may be computed as an entry time period. Then, entry of the counterpart substrate supporting table 10B (10A) may be started when a difference between the exit time period and the entry time period has lapsed from the start of the exiting of the one substrate supporting table 10A (10B). Even in such a case, by computing an exit time period from the start of the exiting to the completion of the exiting (in other words, the completion of a movement to a position where interference is avoidable) by the substrate supporting table 10A (10B) that has finished a printing process and an entry time period from the start of entry to the completion of entry to the print position SP by the substrate supporting table that moves into a next printing process, and starting movement of the other substrate supporting table 10B (10A) when a difference between the exit time period and the entry time period has lapsed from the start of the exiting of the one substrate supporting table 10A (10B), the substrate supporting table 10B (10A) that is going to enter the print position SP can be moved to approach the substrate supporting table that is exiting the print position SP as much as practicable while avoiding interference between the substrate supporting tables 10A and 10B. As a result, switching of printing processes from the substrate supporting table that has finished a printing process to the substrate supporting table that moves into a next printing process can be expedited while avoiding interference.

In addition, a mode for monitoring an interference check may be adopted in combination with or separately from the embodiment described above. In such a case, a mode exemplified below can be adopted as an interference check method.

Figure 15:
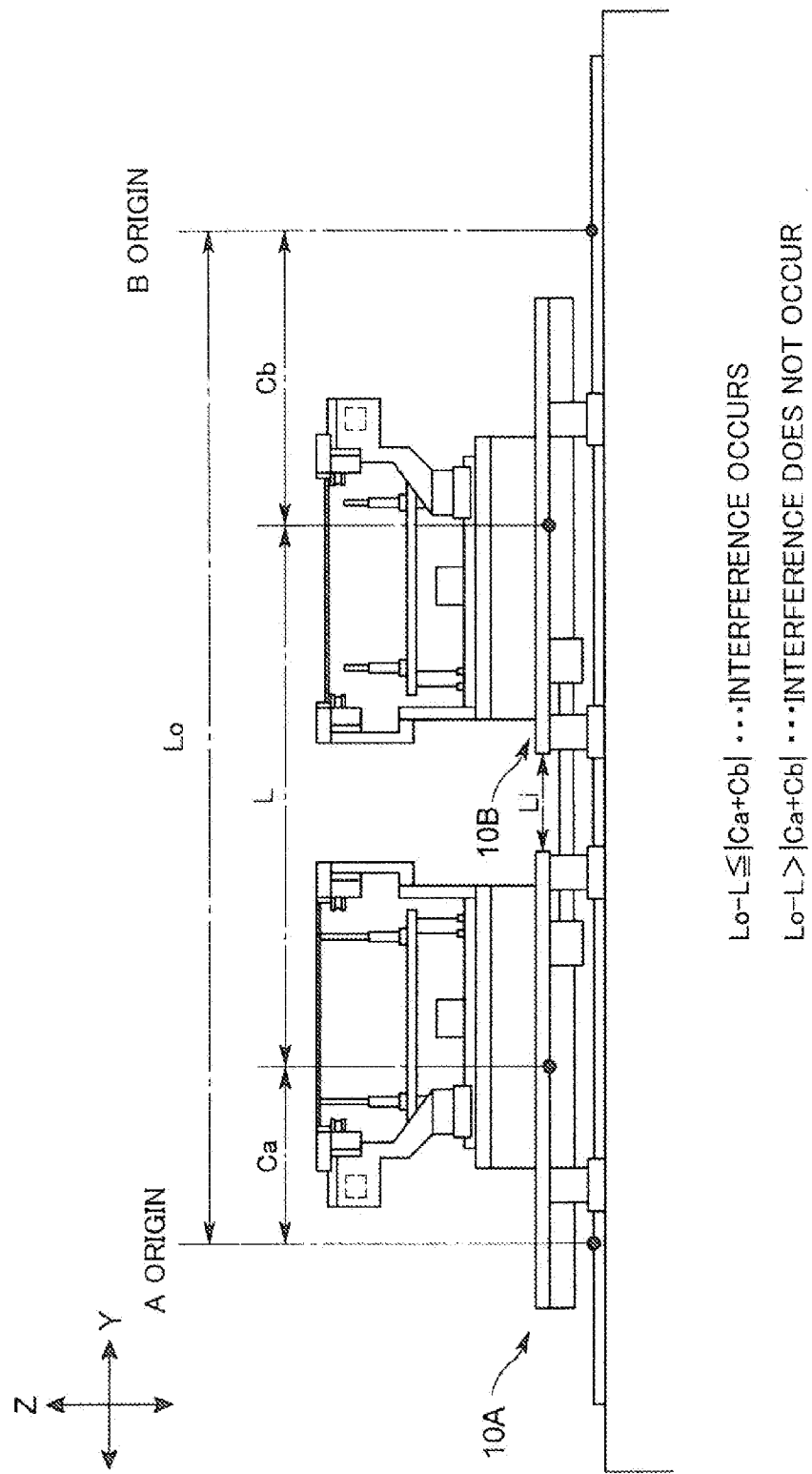
FIG. 15 is a schematic side view showing a mode for an interference check.

Referring now to FIG. 15, a first mode is a method of checking for interference based on an interval Lo between origins (also referred to as an A origin and a B origin) of the respective substrate supporting tables 10A and 10B in case the interval Lo is known. Specifically, central positions of the respective substrate supporting tables 10A and 10B when the substrate supporting tables 10A and 10B are most separated from each other in the Y-axis direction are respectively set as the A origin and the B origin. Since an interval Lo between the A origin and the B origin in the Y-axis direction is known and an interval L at which the substrate supporting tables 10A and 10B may interfere with each other is also known, these pieces of data are registered in advance in the data storage section 63 and an absolute value |Ca+Cb| of a sum of current movement intervals Ca and Cb and a difference between the interval Lo and the interval L are compared with each other. If the absolute value |Ca+Cb| is equal to or greater than the difference between the interval Lo and the interval L, a judgment is made that interference occurs. If the absolute value |Ca+Cb| is smaller than the difference between the interval Lo and the interval L, a judgment is made that interference does not occur. In a similar manner to the "area where interference may occur" in the flow chart shown in FIG. 8, the interval L may be a value that is dynamically set according to models or movement velocities of the respective substrate supporting tables 10A and 10B.

On the other hand, there may be cases where the interval Lo between the A origin and the B origin in the Y-axis direction or the interval L is unknown. In this case, a method such as described below is adopted.

Figure 16:
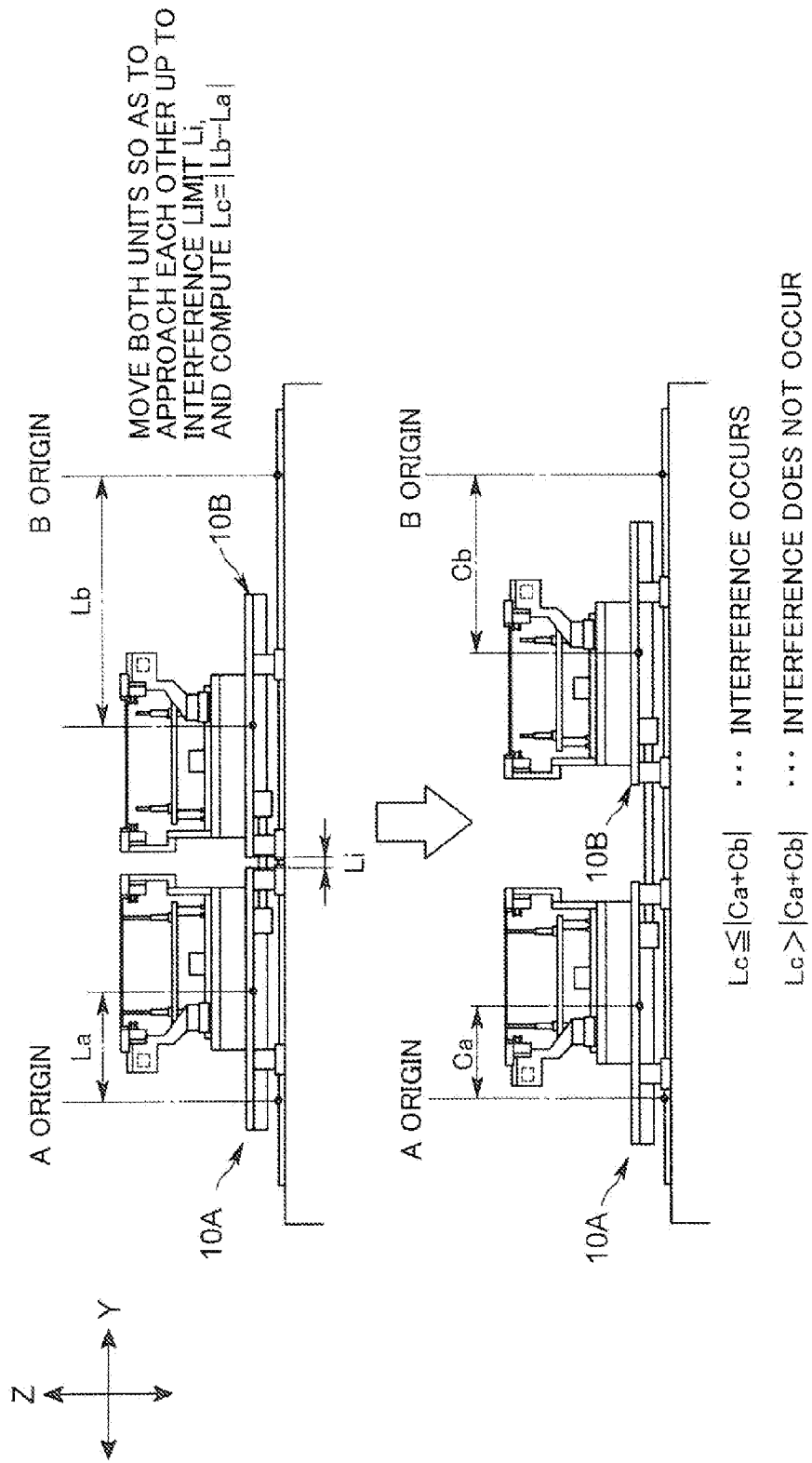
FIG. 16 is a schematic side view showing another mode for the interference check.

Referring now to FIG. 16, when the interval Lo between the A origin and the B origin in the Y-axis direction is unknown, coordinates of the A origin and the B origin are first obtained as shown in FIG. 16A and the substrate supporting tables 10A and 10B are moved so as to approach each other up to the interference limit. Next, a movement amount La of the first substrate supporting table 10A in the Y-axis direction and a movement amount Lb of the second substrate supporting table 10B in the Y-axis direction when the substrate supporting tables 10A and 10B approach each other at the interference limit are obtained. Furthermore, an absolute value |Lb−La| of a difference between the movement amounts La and Lb is computed and set as Lc. In addition, the computation result Lc is registered in advance in the data storage section 63, a current movement interval Ca of the first substrate supporting table 10A in the Y-axis direction and a current movement interval Cb of the second substrate supporting table 10B in the Y-axis direction are obtained, and an absolute value |Ca+Cb| of a sum of the movement intervals Ca and Cb is compared with the computation result Lc registered in advance. If the absolute value |Ca+Cb| is equal to or greater than the computation result Lc, a judgment is made that interference occurs. If the absolute value |Ca+Cb| is smaller than the computation result Lc, a judgment is made that interference does not occur.

By adopting the methods shown in FIGS. 15 and 16, whether or not interference occurs can be checked at a desired timing.

Figure 17:
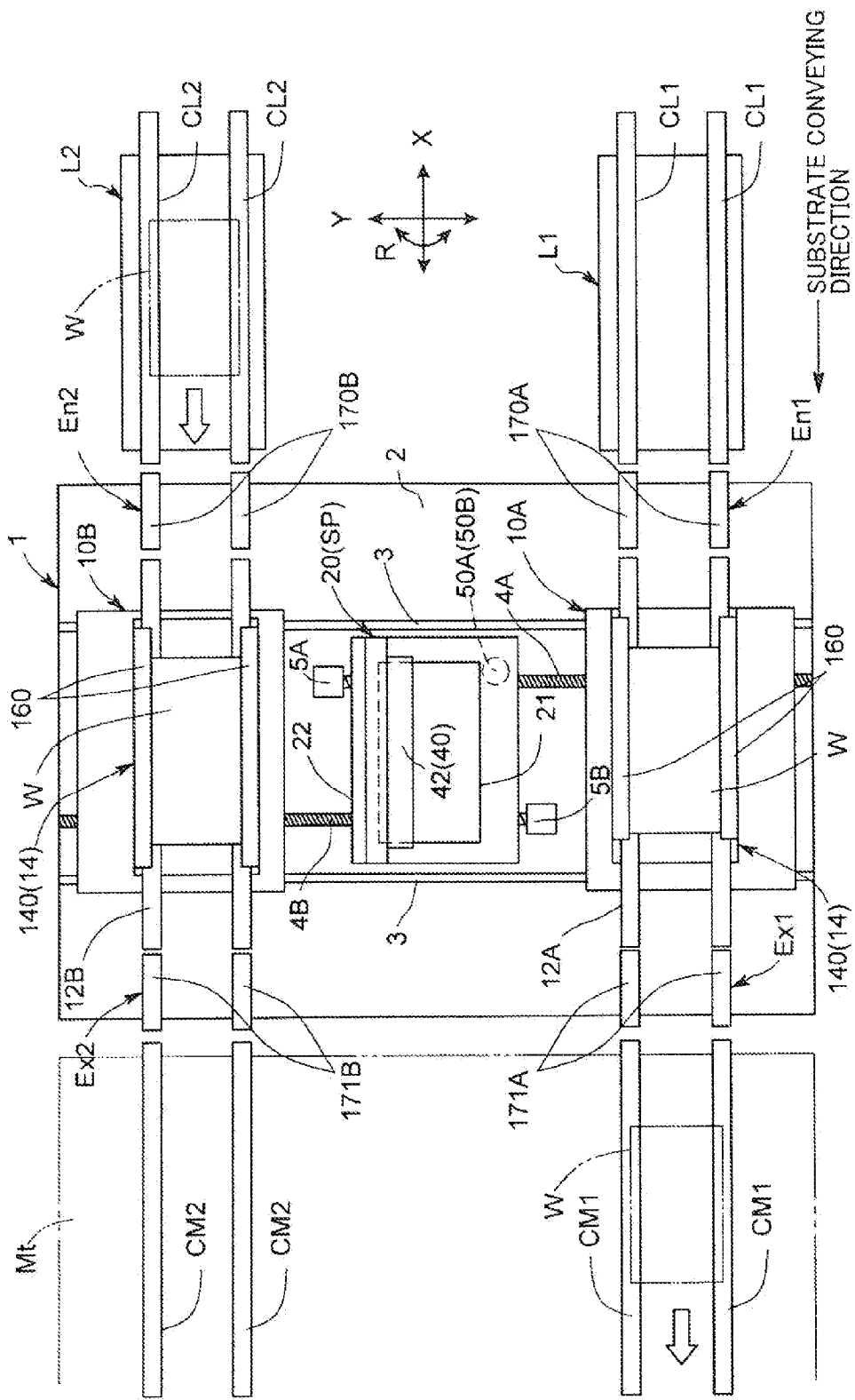
FIG. 17 is a schematic plan view showing another embodiment of the present disclosure.

In addition, as a mode for carrying in or carrying out a substrate W to/from the screen printing machine 1, as shown in FIG. 17, a configuration may be adopted in which a receiving belt conveyor pair 170A and 170B that constitutes the first substrate carry-in section En1 and the second substrate carry-in section En1 is provided on the base 2. In this case, since positioning of the respective belt conveyor pairs CL1 and CL2 of the first loader L1 and the second loader L2 and a corresponding belt conveyor pair 12A and 12B of the first and second substrate supporting tables 10A and 10B can be mechanically determined, there is an advantage that control becomes easier.

In a similar manner, a configuration may be adopted in which a handover belt conveyor pair 171A and 171B that constitutes the first substrate carry-out section Ex1 and the second substrate carry-out section Ex2 is provided on the base 2.

Moreover, although not specifically shown, only a handover conveyor that constitutes one of a substrate carry-in section and a substrate carry-out section may be provided.

It is needless to say that a specific supporting structure of a substrate W provided by the substrate supporting tables 10A and 10B and the like, a specific holding structure of the screen mask 21 provided by the print executing section 20 and the like, a specific structure of the squeegee unit 41, and the like are not necessarily limited to those of the screen printing machine 1 according to the embodiment described above and may be modified as appropriate.

The invention claimed is:

1. A screen printing machine comprising:
a pair of substrate supporting tables including one substrate supporting table and a counterpart substrate supporting table, each of the pair of substrate supporting tables being provided for holding a substrate that is a print object, the substrate supporting tables being juxtaposed along a specific direction, the specific direction being horizontally perpendicular to a conveying direction of the substrate;
a printing executing section that performs a printing process on the substrate held by each of the substrate supporting tables, the printing process being performed at a print position set in a common area being located between the pair of substrate supporting tables with respect to the specific direction along which both of the substrate supporting tables are movable;
a substrate supporting table driving mechanism configured to individually drive the pair of substrate supporting tables in the specific direction; and
a control unit configured to control the substrate supporting table driving mechanism so that the one substrate supporting table that moves into a printing process enters the print position by moving in a direction approaching the counterpart substrate supporting table along the specific direction during movement of the counterpart substrate supporting table that has completed the printing process at the print position as the counterpart substrate supporting table is exiting the print position by moving in a direction receding along the specific direction,
wherein
the control unit controls the substrate supporting table driving mechanism so that the one substrate supporting table completes entry to the print position after the counterpart substrate supporting table completes exiting from the print position, in a way that at least parts of an exit period for the one counterpart substrate supporting table exiting the print position and an entry period for the one substrate supporting table entering the print position overlap each other.

2. The screen printing machine according to claim 1, wherein the control unit controls the substrate supporting table driving mechanism so that, during the time after carrying out a printed substrate and before moving into a next printing process, the one substrate supporting table which has exited the print position approaches the counterpart substrate supporting table located at the print position by an interference limit set in advance.

3. The screen printing machine according to claim 2, wherein the control unit includes:
an interference avoidance necessity judging unit configured to judge whether or not it is necessary to avoid interference between the substrate supporting table entering the print position, and the substrate supporting table exiting the print position; and
a regulating section configured to regulate interference between the two substrate supporting tables when the interference avoidance necessity judging section judges that interference avoidance is necessary.

4. The screen printing machine according to claim 3, wherein the regulating section determines a movement velocity of the substrate supporting table entering the print position according to a difference between a movement velocity of the substrate supporting table entering the print position, and a movement velocity of the substrate supporting table exiting the print position.

5. The screen printing machine according to claim 4, wherein the regulating section determines the movement velocity of the substrate supporting table entering the print position according to an opposing interval between the substrate supporting table entering the print position, and the substrate supporting table exiting the print position.

6. The screen printing machine according to claim 3, wherein the regulating section computes an exit time period from the start of exit of the substrate supporting table that has finished the printing process until moving to a position where interference is avoidable, and an entry time period from the start of entry of the substrate supporting table that moves into a next printing process until moving to a position where interference may occur, thereby starting movement of the substrate supporting table entering the print position when a difference between the exit time period and the entry time period has lapsed.

7. The screen printing machine according to claim 1, wherein the control unit includes:
an interference avoidance necessity judging section configured to judge whether or not it is necessary to avoid interference between the substrate supporting table entering the print position, and the substrate supporting table exiting the print position; and
a regulating section configured to regulate interference between the two substrate supporting tables when the interference avoidance necessity judging section judges that interference avoidance is necessary.

8. The screen printing machine according to claim 7, wherein the regulating section determines a movement velocity of the substrate supporting table entering the print position according to a difference between a movement velocity of the substrate supporting table entering the print position, and a movement velocity of the substrate supporting table exiting the print position.

9. The screen printing machine according to claim 8,
wherein the regulating section determines the movement velocity of the substrate supporting table entering the print position according to an opposing interval between the substrate supporting table entering the print position, and the substrate supporting table exiting the print position.

10. The screen printing machine according to claim 7,
wherein the regulating section computes an exit time period from the start of exit of the substrate supporting table that has finished the printing process until moving to a position where interference is avoidable, and an entry time period from the start of entry of the substrate supporting table that moves into a next printing process until moving to a position where interference may occur, thereby starting movement of the substrate supporting table entering the print position when a difference between the exit time period and the entry time period has lapsed.

11. The screen printing machine according to claim 7,
where the interference avoidance necessity judging section executes a step whether or not the substrate supporting table that is exiting exists within an area at which interference may occur, and if the interference avoidance necessity judging section made a judgment that substrate supporting table that is exiting exists within an area at which interference may occur, the interference avoidance necessity judging section is configured to execute a step of obtaining exit velocity of the substrate supporting table that is exiting and entry velocity of the substrate supporting table that is entering to the print position, and a step of comparing the exit velocity and the entry velocity, and
the interference avoidance necessity judging section is configured to make judgment that the interference avoidance is necessary if the entry velocity is faster than the exit velocity, and the interference avoidance necessity judging section is configured to make judgment that the interference avoidance is unnecessary if the entry velocity is at most the exit velocity.

12. The screen printing machine according to claim 11,
wherein the interference avoidance necessity judging section configured to execute a step of obtaining a current position of the substrate supporting table exiting from the print position, and an area judgment step of judging whether or not the substrate supporting table is in an area in which interference may occur, and
wherein the interference avoidance necessity judging section configured to make judgment that the interference avoidance is unnecessary in cases where the judgment is made that the substrate supporting table does not exist at the area in which interference may occur, and where entry velocity of entering substrate supporting table is in at most exit velocity of exiting substrate supporting table.

13. The screen printing machine according to claim 1,
wherein the control unit computes an exit time period from the start of exiting to the completion of exiting of the substrate supporting table that has finished the printing process and an entry time period from the start of entry to the completion of entry to the print position of the substrate supporting table that moves into a next printing process, and starts entry of one substrate supporting table when a difference between the exit time period and the entry time period has lapsed from the start of exit of the other substrate supporting table.

14. The screen printing machine according to claim 1,
wherein the control unit is configured to control overall a series of print processing operations by the pair of substrate supporting tables and the print executing section.

15. The screen printing machine according to claim 14,
wherein the control unit is configured to control the pair of substrate supporting tables so that the pair of substrate supporting tables are respectively driven independently.

16. The screen printing machine according to claim 15,
wherein the control unit is configured to control concurrent operations wherein an operation of the one substrate supporting table entering toward the print position is in parallel with an operation of the counterpart substrate supporting table exiting from the print position such that at least a part of a first period and a second period overlap to each other, wherein the first period is a period during which the one substrate supporting table among the pair of substrate supporting tables enters toward the print position, and the second period is a period during which the counterpart substrate supporting table exits the print position.

17. The screen printing machine according to claim 15,
wherein the control unit is configured to control an execution of operations for each of the pair of substrate supporting tables by a number of times corresponding to a number of substrates to be produced, the operations includes a carry-in of substrate, a mark recognition, an entry subroutine of the substrate supporting tables to the common area, a plate alignment, a scraping operation for scraping off cream solder, a plate releasing operation, an exit operation of the substrate supporting tables from the common area, and a carry-out operation for carrying out a printed substrate after exit.

18. The screen printing machine according to claim 17,
wherein the control unit includes an interference avoidance necessity judging section configured to execute a judgment whether or not it is necessary to avoid interference between the substrate supporting table entering the print position and the substrate supporting table exiting the print position, and
wherein the interference avoidance necessity judging section configured to execute the judgment in a case where the entry subroutine of the substrate supporting tables is executed, and within a time period in which the substrate supporting table entering the print position moves between a receiving position where the substrate supporting table entering the print position receives a substrate and the print position.

19. The screen printing machine according to claim 18,
wherein the control unit includes a regulating section configured to regulate interference between the two substrate supporting tables when the interference avoidance necessity judging section judges that interference avoidance is necessary,
wherein the control unit configured to execute an axial movement in one of cases where the interference avoidance is judged to be necessary and an interference avoiding process is terminated by the regulating section, and where the interference avoidance necessity judging section judges that interference avoidance is unnecessary, the axial movement is an operation of driving the substrate supporting table drive mechanism upon setting entry velocity of the substrate supporting table that is about to enter to the print position, based on a distance between the receiving position and the print position, wherein the control unit is configured to judge whether or not the substrate supporting table that is about to enter to the print position arrives at the print position during operation of the axial movement, wherein the control unit is configured to execute a process of executing a judgment whether or not the interference avoidance is necessary in a case where the substrate supporting table is entering to the print position, and wherein the control unit is configured to move on to the plate alignment in a case where the substrate supporting table has entered to the print position.

20. The screen printing machine according to claim 1, wherein the pair of substrate supporting tables respectively comprises a belt conveyor pair extending in the conveying direction of the substrate, a clamp unit configured to hold the substrate on the belt conveyor pair so as to be printable, a clamp unit drive mechanism configured to drive the clamp unit in the conveying direction of the substrate along the belt conveyor pair.

* * * * *